(12) United States Patent
Parikh

(10) Patent No.: US 12,142,487 B2
(45) Date of Patent: Nov. 12, 2024

(54) METHODS OF MODIFYING PORTIONS OF LAYER STACKS

(71) Applicant: Applied Materials, Inc., Santa Clara, CA (US)

(72) Inventor: Suketu Arun Parikh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 918 days.

(21) Appl. No.: 17/197,969

(22) Filed: Mar. 10, 2021

(65) Prior Publication Data

US 2021/0375637 A1 Dec. 2, 2021

Related U.S. Application Data

(63) Continuation of application No. 17/157,546, filed on Jan. 25, 2021, now Pat. No. 11,658,041.

(60) Provisional application No. 63/031,315, filed on May 28, 2020.

(51) Int. Cl.
| | |
|---|---|
| *H01L 21/321* | (2006.01) |
| *H01L 21/02* | (2006.01) |
| *H01L 21/3213* | (2006.01) |
| *H01L 21/762* | (2006.01) |

(Continued)

(52) U.S. Cl.
CPC .... *H01L 21/3212* (2013.01); *H01L 21/02183* (2013.01); *H01L 21/32139* (2013.01); *H01L 21/762* (2013.01); *H01L 23/00* (2013.01); *H01L 23/5226* (2013.01)

(58) Field of Classification Search
CPC ........... H01L 21/3212; H01L 21/02183; H01L 21/32139; H01L 21/762; H01L 23/00; H01L 23/5226; H01L 23/544; H01L 2223/54426; H01L 2223/54453; H01L 21/76816; H01L 21/76877; H01L 21/76885; H01L 21/76897; H01L 23/5286;

(Continued)

(56) References Cited

U.S. PATENT DOCUMENTS

| | | | |
|---|---|---|---|
| 5,532,516 A | * | 7/1996 | Pasch .................. H01L 23/5226 257/E23.152 |
| 5,654,216 A | | 8/1997 | Adrian |
| 6,127,263 A | | 10/2000 | Parikh |

(Continued)

OTHER PUBLICATIONS

International Search Report/Written Opinion issued to PCT/US2021/021916 on Jul. 2, 2021.

(Continued)

*Primary Examiner* — Karen Kusumakar
(74) *Attorney, Agent, or Firm* — Patterson + Sheridan, LLP

(57) ABSTRACT

Embodiments provided herein generally relate to methods of modifying portions of layer stacks. The methods include forming deep trenches and narrow trenches, such that a desirably low voltage drop between layers is achieved. A method of forming a deep trench includes etching portions of a flowable dielectric, such that a deep metal contact is disposed below the deep trench. The deep trench is selectively etched to form a modified deep trench. A method of forming a super via includes forming a super via trench through a second layer stack of a layer superstack. The methods disclosed herein allow for decreasing the resistance, and thus the voltage drop, of features in a semiconductor layer stack.

20 Claims, 18 Drawing Sheets

(51) Int. Cl.
*H01L 23/00* (2006.01)
*H01L 23/522* (2006.01)

(58) Field of Classification Search
CPC ......... H01L 21/31144; H01L 21/76829; H01L 21/76837; H01L 21/7684; H01L 21/76843
See application file for complete search history.

(56) References Cited

U.S. PATENT DOCUMENTS

| | | | |
|---|---|---|---|
| 6,225,207 B1 | 6/2001 | Parikh | |
| 6,352,917 B1 | 3/2002 | Gupta et al. | |
| 6,541,397 B1 | 4/2003 | Bencher | |
| 6,594,540 B1 | 7/2003 | Parikh | |
| 7,902,661 B2 | 3/2011 | Smeys et al. | |
| 9,412,581 B2 | 8/2016 | Thadani et al. | |
| 9,646,876 B2 | 5/2017 | Padhi et al. | |
| 9,653,320 B2 | 5/2017 | Agarwal et al. | |
| 9,865,459 B2 | 1/2018 | Cheng et al. | |
| 9,960,045 B1 | 5/2018 | Purayath et al. | |
| 10,629,484 B1 | 4/2020 | Parikh et al. | |
| 2003/0183940 A1 | 10/2003 | Noguchi et al. | |
| 2007/0264824 A1 | 11/2007 | Siew et al. | |
| 2009/0267166 A1 | 10/2009 | Verheijden et al. | |
| 2012/0032344 A1 | 2/2012 | Usami | |
| 2013/0082393 A1* | 4/2013 | Kawamura | H01L 23/53295 257/773 |
| 2016/0079115 A1 | 3/2016 | Lee et al. | |
| 2016/0163587 A1* | 6/2016 | Backes | H01L 23/53238 257/751 |
| 2016/0204190 A1 | 7/2016 | Chu et al. | |
| 2016/0293609 A1 | 10/2016 | Jha et al. | |
| 2017/0338148 A1* | 11/2017 | Shusterman | H01L 23/53252 |
| 2017/0372960 A1 | 12/2017 | Mebarki et al. | |
| 2018/0061703 A1 | 3/2018 | Edelstein et al. | |
| 2018/0145035 A1 | 5/2018 | Singh et al. | |
| 2018/0233402 A1 | 8/2018 | Suganaga | |
| 2019/0035677 A1 | 1/2019 | Chandhok et al. | |
| 2019/0371657 A1 | 12/2019 | Chandhok et al. | |
| 2020/0066630 A1 | 2/2020 | Bao et al. | |
| 2020/0144195 A1* | 5/2020 | Yang | H01L 23/5329 |
| 2020/0238522 A1* | 7/2020 | Hirakawa | B25J 9/1694 |

OTHER PUBLICATIONS

Moroz et al., "Can We Ever Get to a 100 nm Tall Library? Power Rail Design for 1nm Technology Node". Synopsys, Inc., Mountain View, CA, USA, Synopsys, Glasgow, UK, Applied Materials Santa Clara CA USA.

* cited by examiner

METHODS OF MODIFYING PORTIONS OF LAYER STACKS

CROSS REFERENCE TO RELATED APPLICATION

This application is a Continuation Application of U.S. Non-Provisional application Ser. No. 17/157,546, filed on Jan. 25, 2021, and hereby claims priority under 35 U.S.C. § 119 to U.S. Provisional Patent Application No. 63/031,315, filed on May 28, 2020, the contents of each is incorporated herein in its entirety.

BACKGROUND

Field

Embodiments of the invention relate to a method and, more specifically, to a method of modifying portions of layer stacks.

Description of the Related Art

Semiconductor devices such as integrated circuits (IC) generally have electronic circuit elements, such as transistors, diodes and resistors, fabricated integrally on a single body of semiconductor material. The various circuit elements are connected through conductive connectors to form a complete circuit, which can contain millions of individual circuit elements. Advances in semiconductor materials and processing techniques have resulted in reducing the overall size of the IC while increasing the number of circuit elements. Additional miniaturization is highly desirable for improved IC performance and cost reduction.

Interconnects provide the electrical connections between the various electronic elements of an IC, and also between these elements and the device's external contact elements, such as pins, for connecting the IC to other circuits. Typically, interconnect lines form the horizontal connections between the electronic circuit elements, while conductive via plugs form the vertical connections between the electronic circuit elements, resulting in layered connections.

A variety of techniques are employed to create interconnect lines and vias. One such technique involves a process generally referred to as dual damascene, which includes forming a trench and an underlying via hole. The trench and the via hole are simultaneously filled with a conductor material, for example a metal, thus simultaneously forming an interconnect line and an underlying via plug.

One drawback in the current art is that materials being used as vias and other metallic connections in layer stacks have undesirably high resitivities. The high resitivities result in high voltage drops between layers, which can cause shorts in the stack. In addition, certain geometries of the vias and interconnects can further increase the resistance of the vias and interconnects.

Therefore, there is a need for methods of growing vias or other interconnects in layer stacks without undesirably high resistances.

SUMMARY

Embodiments provided herein generally relate to methods of modifying portions of layer stacks. The methods include forming deep trenches and narrow trenches, such that a desirably low voltage drop between layers is achieved.

In one embodiment, a method of forming a modified deep trench in a layer stack is provided. The method includes selectively etching a deep trench disposed in the layer stack to form the modified deep trench, such that at least a portion of a deep metal contact is exposed, depositing a barrier layer in the modified deep trench, depositing a first filler material over the barrier layer, and removing first undesired portions of the first filler material.

In another embodiment, a method of forming a deep trench in a layer stack is provided. The method includes etching the deep trench in a flowable dielectric, such that a deep metal contact is disposed below the deep trench, depositing a barrier layer in the deep trench, depositing a first filler material over the barrier layer, and removing first undesired portions of the first filler material.

In yet another embodiment, a method of forming a via trench and a super via trench in a layer superstack is provided. The layer superstack includes a first layer stack and a second layer stack. The second layer stack is disposed over the first layer stack. The method includes forming the via trench in the second layer stack and forming the super via trench through the second layer stack, such that a portion of a first filler material of the first layer stack is exposed.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
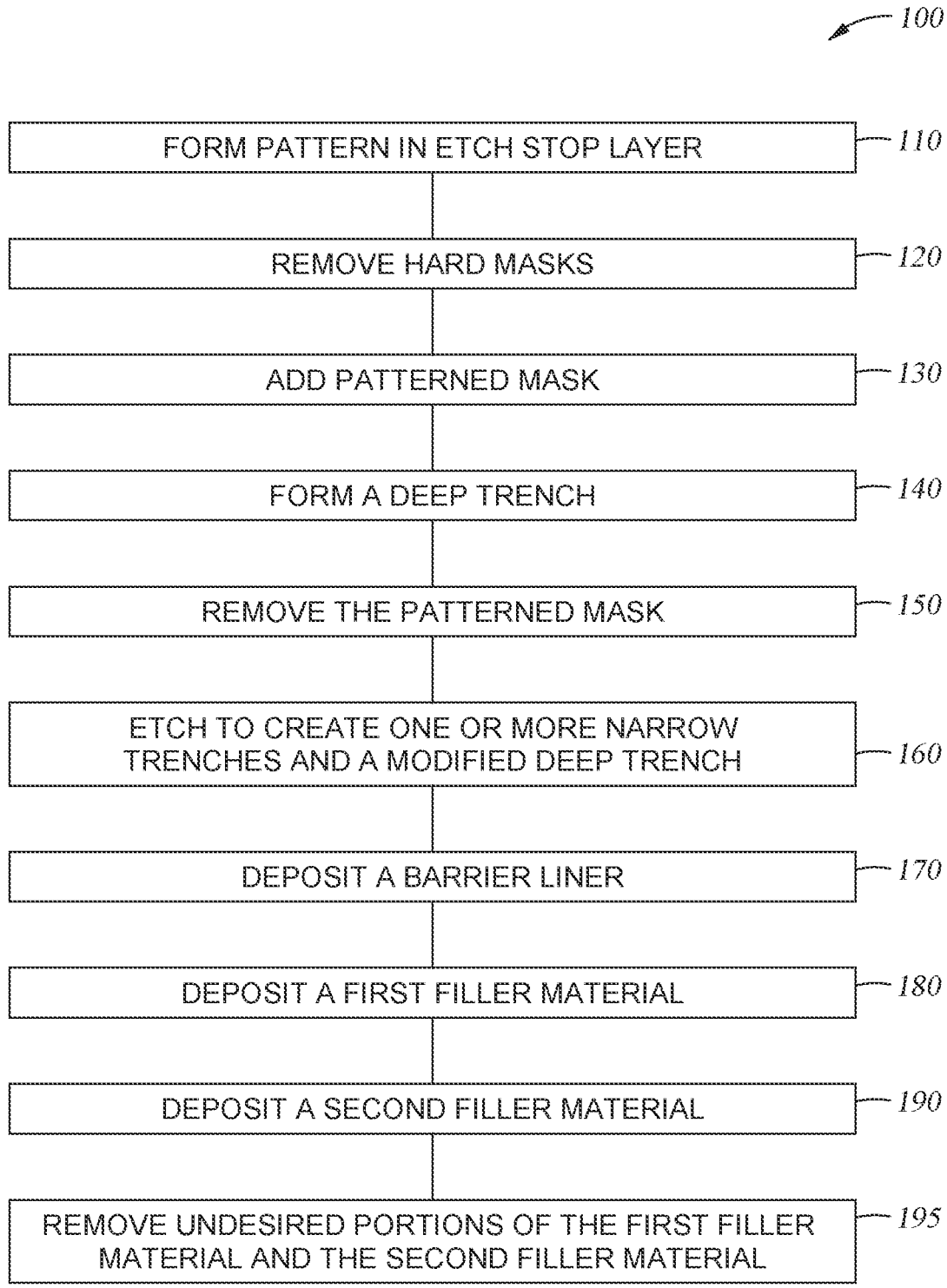
FIG. 1 is a flow chart of method operations for forming a modified deep trench in a layer stack, according to one embodiment.

Embodiments provided herein generally relate to methods of modifying portions of layer stacks. The methods include forming deep trenches and narrow trenches, such that a desirably low voltage drop between layers is achieved. A method of forming a deep trench includes etching portions of a flowable dielectric, such that a deep metal contact is disposed below the deep trench. The deep trench is selectively etched to form a modified deep trench. A method of forming a super via includes forming a super via trench through a second layer stack of a layer superstack. The methods disclosed herein allow for decreasing the resistance, and thus the voltage drop, of features in a semiconductor layer stack. The methods allow for changing layer materials to higher resistivity features, as the higher resistance from the material change is at least partially counteracted by modifications of the feature shapes and depths, as described above. In addition, including narrow trenches allows simultaneous dropping of the time constant of the layer stack. Embodiments disclosed herein can be useful for, but are not limited to, creating filled trenches and filled vias with desirably low resistances and voltage drops.

As used herein, the term "about" refers to a +/−10% variation from the nominal value. It is to be understood that such a variation can be included in any value provided herein.

In various embodiments of the present disclosure, layers or other materials are referred to as being deposited. It is understood that the deposition of these materials can be performed using any conventional methods used in semiconductor manufacturing, such as, but not limited to, chemical vapor deposition (CVD), atomic layer deposition (ALD), physical vapor deposition (PVD), electroplating, electroless plating, the selective deposition of any of the above, combinations of the above, and any other suitable method. It is to be understood that when a method operation is described herein as depositing a material in two or more separate locations, the depositions can occur simultaneously, or the material can be deposited in separate suboperations.

In various embodiments of the present disclosure, layers or other materials are referred to as being etched. It is understood that the etching of these materials can be performed using any conventional methods used in semiconductor manufacturing, such as, but not limited to, reactive ion etching (RIE), dry etching, wet etching, plasma etching, microloading, the selective etching of any of the above, combinations of the above, and any other suitable method. It is to be understood that when a method operation is described herein as etching two or more types of materials, the etching can occur simultaneously with the same etching process, or the etching can be performed in separate suboperations using different etching processes. For example, an operation describing etching a metal and a dielectric includes a first etching suboperation using a first etching process that etches the metal, and the operation further includes a second etching suboperation using a second etching process that etches the dielectric.

FIG. 1 is a flow chart of method 100 operations for forming a modified deep trench in a layer stack (e.g., layer stack 200 of FIG. 2A), according to one embodiment. Although the method 100 operations are described in conjunction with FIGS. 1 and 2A-2K, persons skilled in the art will understand that any system configured to perform the method 100 operations, in any order, falls within the scope of the embodiments described herein.

Figure 2A:
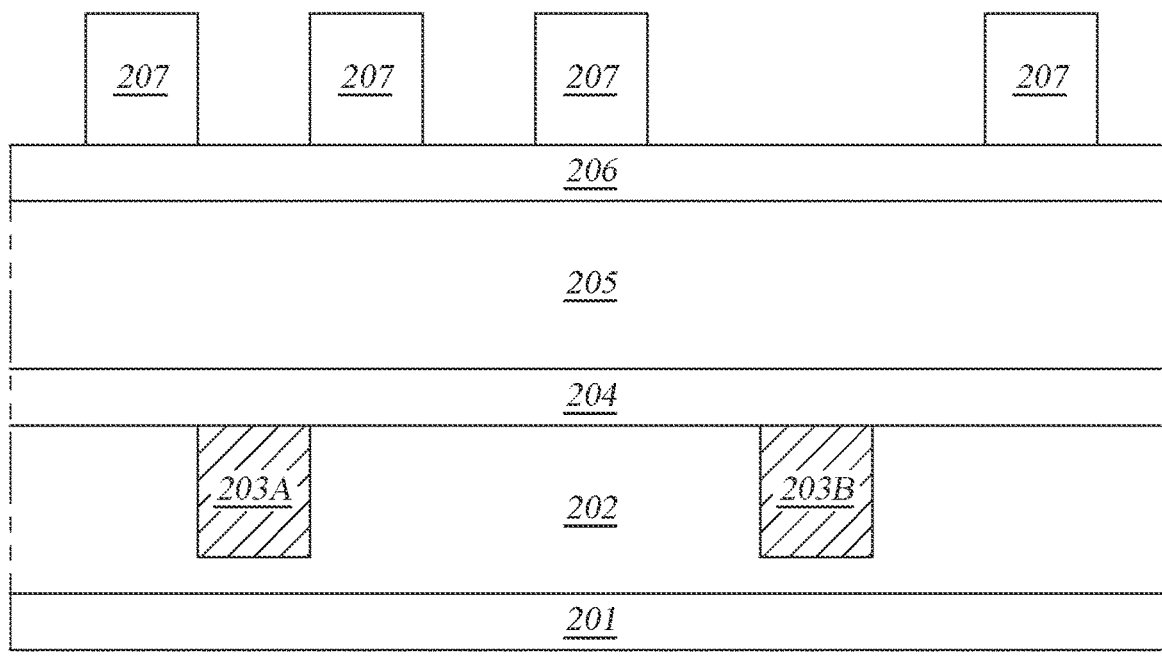
FIGS. 2A-K illustrate a layer stack, according to one embodiment.

FIG. 2A illustrates the layer stack 200, according to one embodiment. As shown, the layer stack 200 includes a substrate 201, a first dielectric layer 202, a plurality of metal contacts 203 (e.g., 203A, 203B), a first etch stop layer 204 (ESL), a second dielectric layer 205, a second etch stop layer (ESL) 206, and a plurality of hard masks 207. The substrate 201 can include any substrate used in semiconductor processing. The substrate 201 can be semiconducting. The substrate 201 can be a flat, featureless silicon (Si) wafer. The substrate 201 can be a patterned silicon wafer as is typically used in logic gates, input/output (I/O) gates, field effect transistors (FET), fin field effect transistors (finFET), or memory applications.

The substrate 201 can include crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. The substrate 201 can be configured as a 200 mm, 300 mm, or 450 mm diameter wafer, or as a rectangular or square panel. The substrate 201 can contain alignment marks (not shown) or other features on a surface of the substrate 201 to help align and position various patterns, to ensure that the correct layer pattern is grown or etched. The substrate 201 can include any number of metallic, semiconducting, and/or insulating materials disposed thereon.

The first dielectric layer 202 is disposed over the substrate 201. The first dielectric layer 202 can include a low-k dielectric material, such as silicon oxycarbide (SiOC). The plurality of metal contacts 203 are disposed in the first dielectric layer 202. The plurality of metal contacts 203 include at least one narrow metal contact 203A and at least one deep metal contact 203B. The plurality of metal contacts 203 include a conducting material, such as tungsten (W), cobalt (Co), ruthenium (Ru), any alloy of the above, or any combination of the above.

The first ESL 204 is disposed over the first dielectric layer 202. The first ESL 204 can include any etch stop used in the art. The first ESL 204 includes silicon-carbon nitride (SiCN), aluminum oxide ($Al_xO_y$), or any combination of the above. In some embodiments, a portion of at least one of the plurality of contacts 203 extends beyond the ESL 204.

The second dielectric layer 205 is disposed over the first ESL 204. The second dielectric layer 205 includes any of the material of the first dielectric layer 202. The second ESL 206 is disposed over the second dielectric layer 205. The second ESL 206 includes any of the material of the first ESL 204. The plurality of hard masks 207 includes any mask used in the art for selective etching, such as spin-on carbon, amorphous carbon, or bottom anti-reflective coatings (BARC).

Figure 2B:
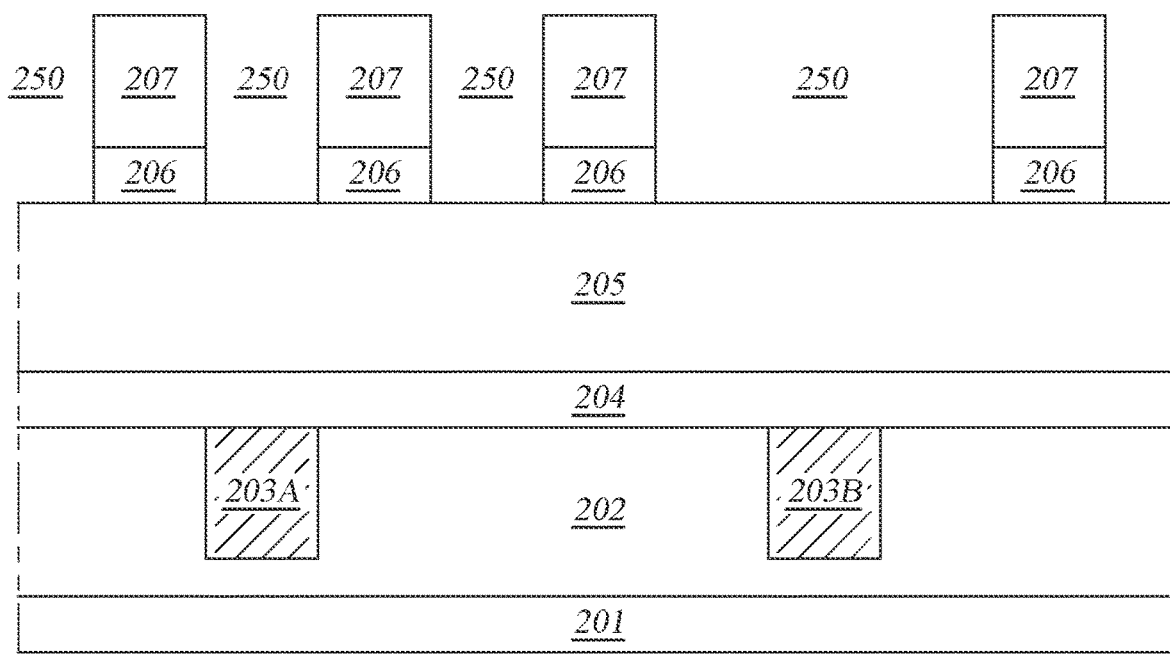

The method 100 begins at operation 110, where a pattern is formed in an etch stop layer (e.g., pattern 250 is formed in the second ESL 206), as shown in FIG. 2B. The pattern 250 is formed using any conventional method of etching, and the pattern is formed by etching away portions of the second ESL 206 that is not covered by the plurality of hard masks 207.

Figure 2C:
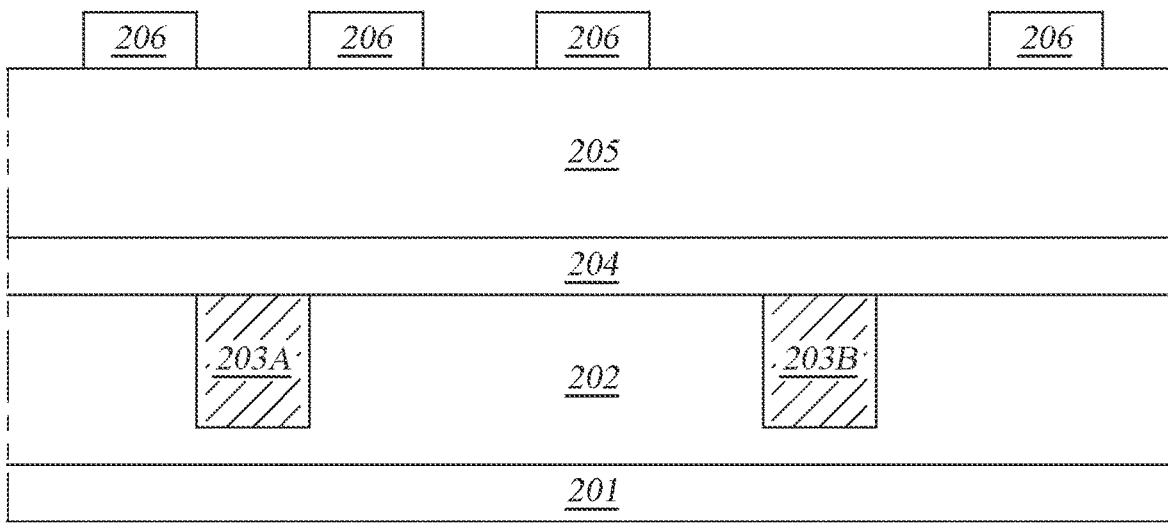

At operation 120, the hard masks 207 are removed, as shown in FIG. 2C. The hard masks 207 can be removed by any process typically used in the art. The operation 120 depends on the type of the hard masks 207 used.

Figure 2D:
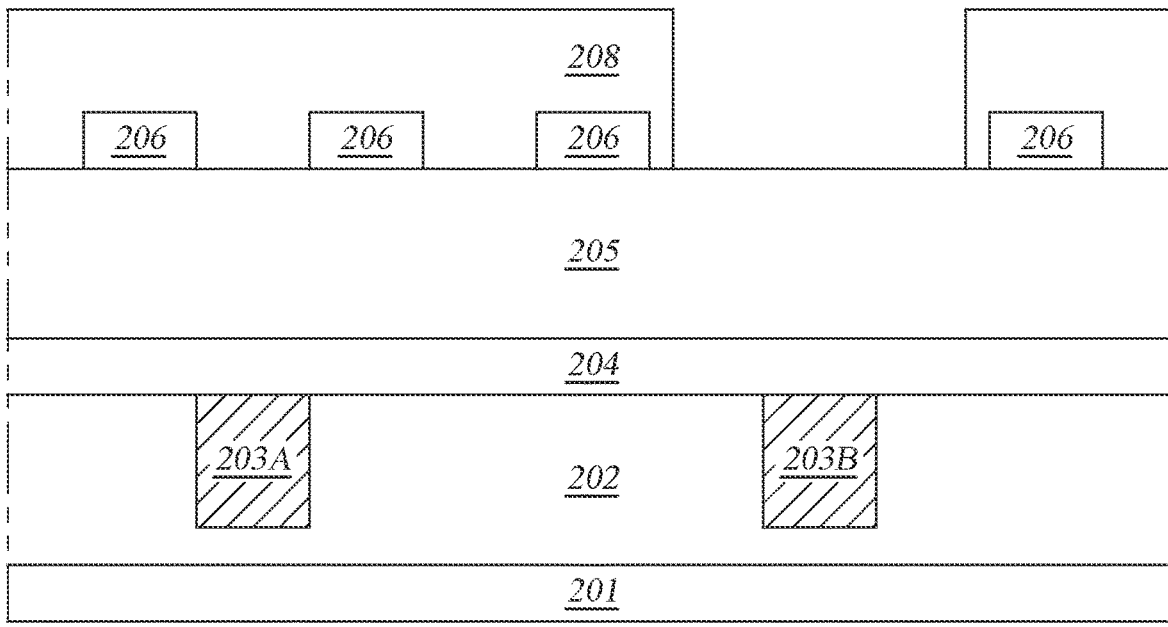

At operation 130, a patterned mask (e.g., patterned mask 208) is deposited over the second ESL 206, as shown in FIG. 2D. The patterned mask 208 allows the selective etching or deposition of material on the underlying layer stack 200, as the patterned mask protects certain regions from unwanted etching in subsequent processes. The patterned mask 208 can include a photoresist material or a deposited layer of self-assembled monolayers (SAM). The patterned mask 208 can include carbon (C), such as amorphous carbon. A mask can be deposited in one layer in a first suboperation, and then the layer is patterned to form the patterned mask 208 in a second suboperation.

Figure 2E:
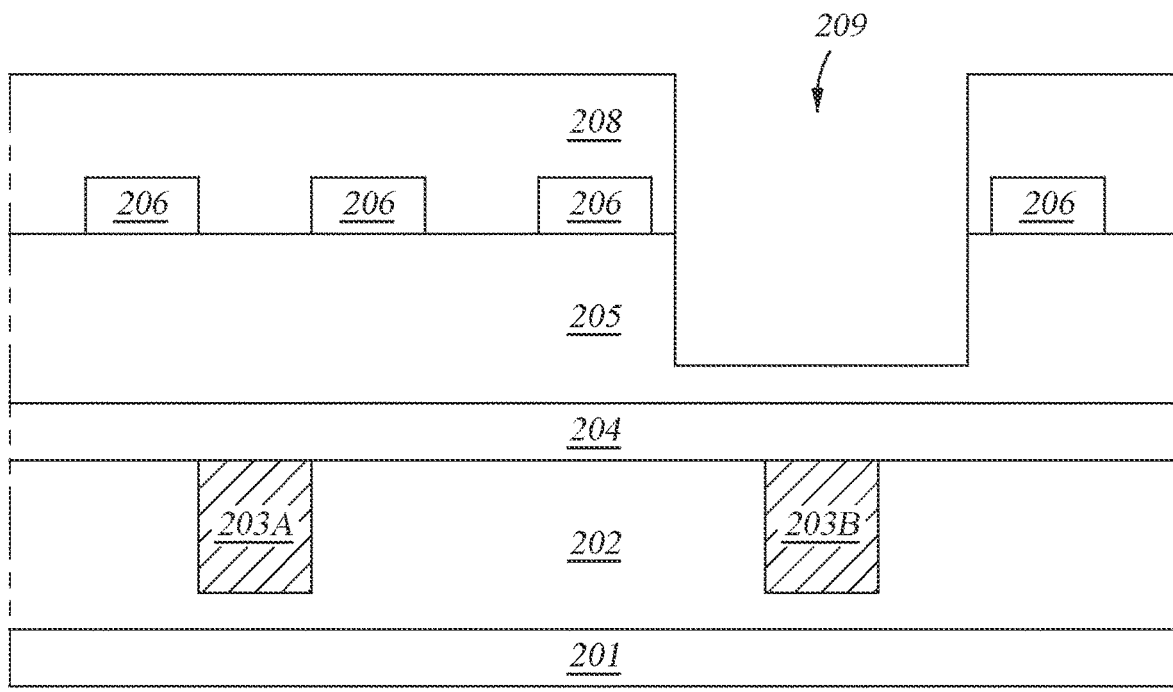

At operation 140, a deep trench (e.g., deep trench 209) is formed by selectively etching portions of the second ESL 206 and the second dielectric layer 205, as shown in FIG. 2E. The deep trench 209 is created by etching through areas of the layer stack 200 not covered by the patterned mask 208. The deep trench 209 can be etched at a depth of about 100 Å to about 200 Å. Although in FIG. 2E the deep trench 209 partially penetrates the second dielectric layer 205, in some embodiments, the deep trench completely penetrates the second dielectric layer 205 and partially or completely penetrates the first ESL 204.

Figure 2F:
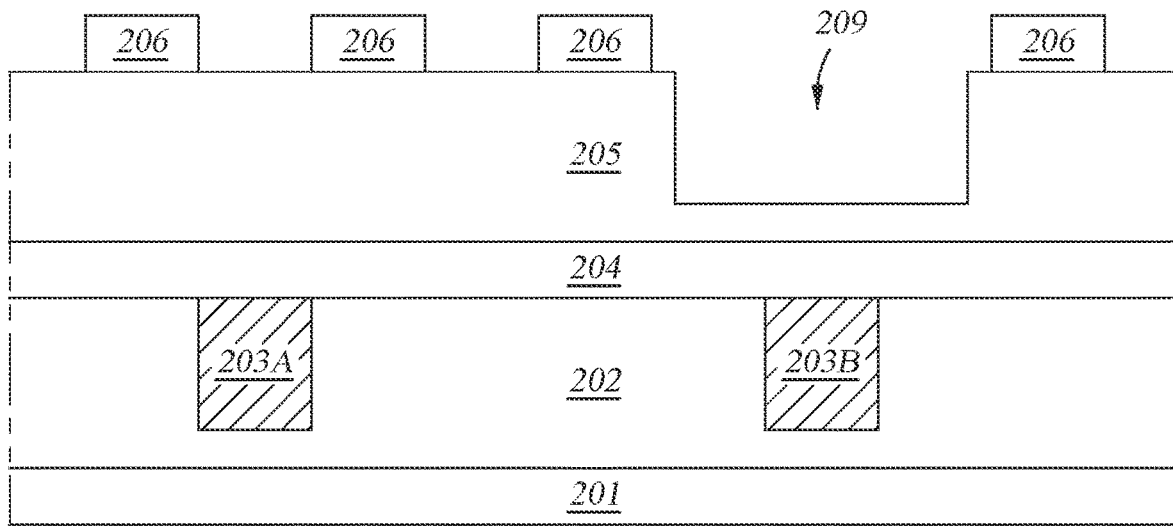

At operation 150, the patterned mask 208 is removed, as shown in FIG. 2F. The patterned mask 208 can be removed by any process typically used in the art. The operation 130 depends on the type of patterned mask 208 used.

Figure 2G:
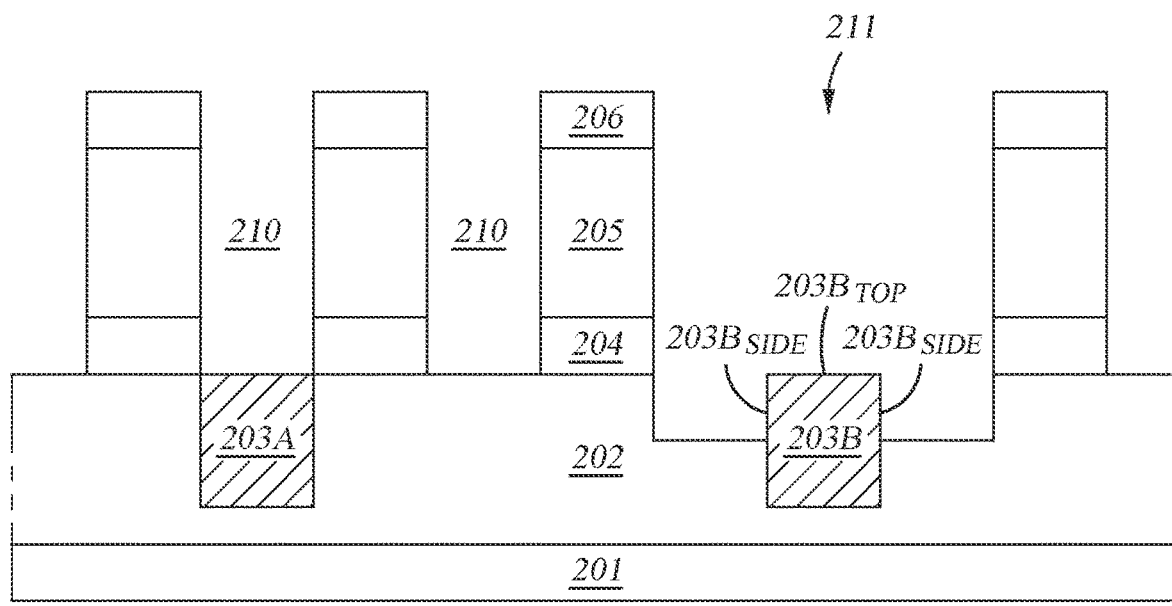

At operation 160, the deep trench is selectively etched such that a modified deep trench (e.g., modified deep trench 211) is formed, as shown in FIG. 2G. The modified deep trench 211 is created by etching through areas of the deep trench 209. The modified deep trench 211 is created by selectively etching portions of the first dielectric layer 202. The modified deep trench 211 exposes at least a portion of the deep metal contact 203B. In some embodiments, the modified deep trench 211 exposes a top surface 203BTop and portions of side surfaces 203BSide of the deep metal contact 203B. Operation 160 can include any of the etching processes disclosed herein. The depth of the modified deep trench 211 varies from about 150 Å to about 300 Å. The modified deep trench 211 can be used as a power rail.

Operation 160 further includes forming one or more narrow trenches (e.g., one or more narrow trenches 210), according to one embodiment. The one or more narrow trenches 210 are formed by selectively etching portions of the second ESL 206 and the second dielectric layer 205. The one or more narrow trenches 210 are created by etching through areas of the layer stack 200 not covered by the pattern 250. At least one of the narrow trenches 210 exposes at least a portion of the narrow metal contact 203A, according to one embodiment. The depth of the narrow trenches 210 is from about 100 Å to about 200 Å. The narrow trenches 210 have a depth-to-width aspect ratio (AR) of about 3.5:1.

The pattern 250 is used to position and control the widths of the etching to create the one or more narrow trenches 210 and the modified deep trench 209. The one or more narrow trenches 210 and the modified deep trench 209 can be etched at different depths. For example, the one or more narrow trenches 210 has a smaller depth than the deep trench 209 and/or modified deep trench 211. In another example, the one or more narrow trenches 210 do not completely etch through the first ESL 204, whereas the deep trench 209 etches partially or entirely through the first ESL. The depth of the deep trench 209 varies from about 150 Å to about 350 Å.

Figure 2H:
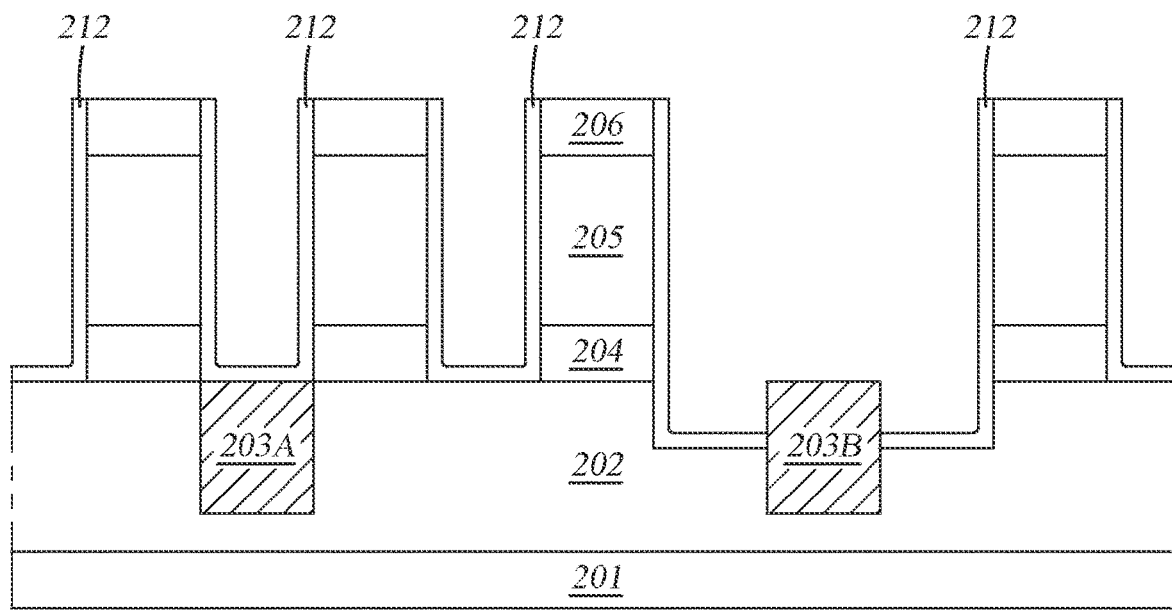

At operation 170, a barrier layer (e.g., barrier layer 212) is deposited in the modified deep trench 211, as shown in FIG. 2H. The barrier layer 212 improves the adhesion of the layers deposited thereon, and reduces grain size of layers deposited thereon. The barrier layer 212 can include tantalum nitride (TaN). In some embodiments, the barrier layer 212 is deposited on exposed portions of the deep metal contact 203B. In other embodiments, the barrier layer 212 is not deposited on exposed portions of the deep metal contact 203B, due to selective deposition of the barrier layer.

Figure 2I:
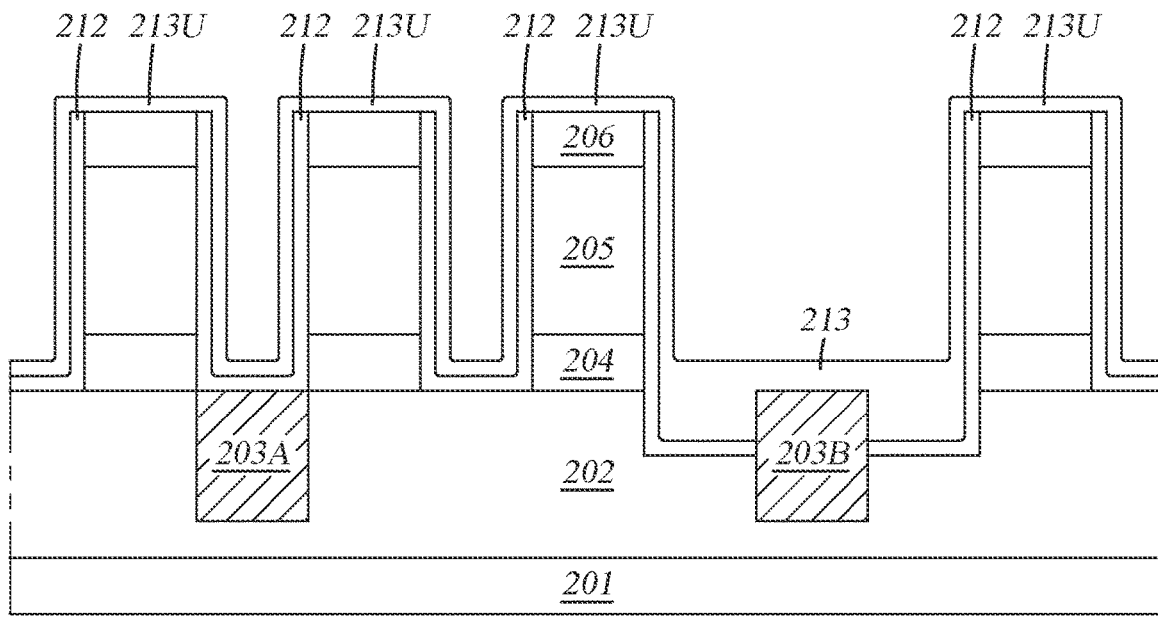

At operation 180, a first filler material (e.g., first filler material 213) is deposited over the barrier layer 212, as shown in FIG. 2I. The first filler material 213 at least partially fills the modified deep trench 209. The first filler material 213 can be deposited using CVD, electroless plating, selective deposition, PVD, or any combination of the above. The first filler material 213 at least partially fills the one or more narrow trenches 210, according to one embodiment. The first filler material 213 includes a conductive material. The first filler material 213 includes cobalt (Co), tungsten (W), copper (Cu), any alloy of the above, and any combination of the above, according to one embodiment. In some embodiments, first undesired portions 213U of the first filler material 213 are present at various locations over the layer stack 200. The first undesired portions 213U can be removed in further operations, as described below.

Figure 2J:
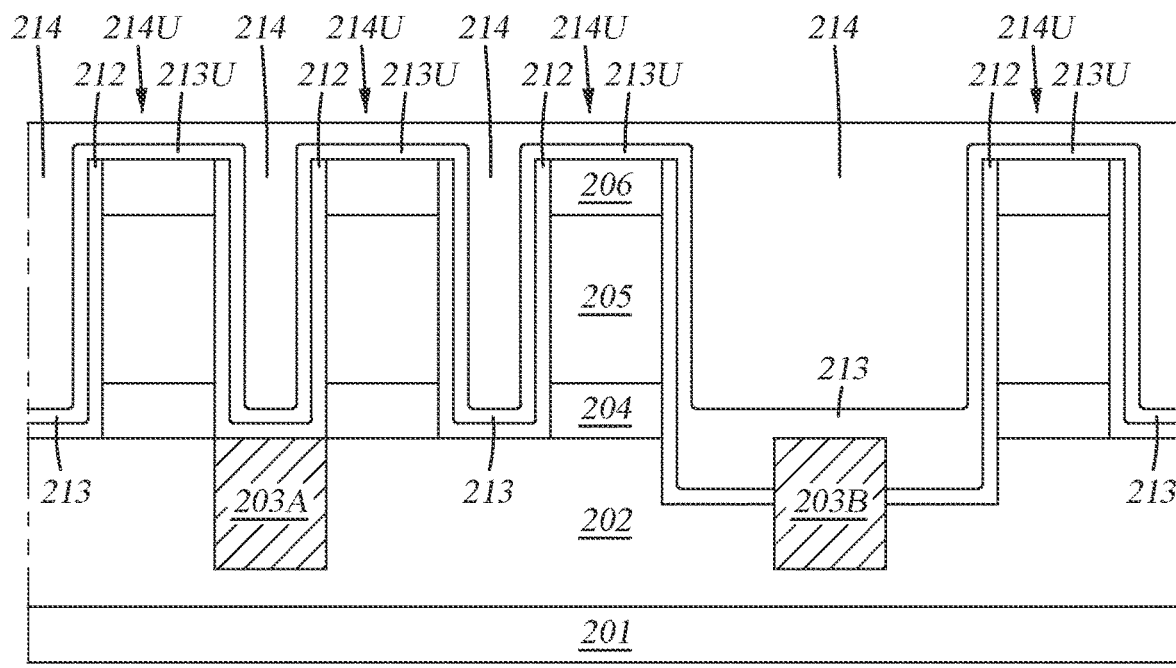

At operation 190, a second filler material (e.g., second filler material 214) is deposited over the first filler material 213, as shown in FIG. 2J. The second filler material 214 at least partially fills the modified deep trench 209. The second filler material 214 at least partially fills the one or more narrow trenches 210, according to one embodiment. The second filler material 214 includes a conductive material. The second filler material 214 includes cobalt (Co), tungsten (W), copper (Cu), any alloy of the above, and any combination of the above, according to one embodiment. The second filler material 214 includes a conductive material different that the conductive material of the first filler material 213, according to one embodiment. In some embodiments, second undesired portions 214U of the second filler material 214 are present at various locations over the layer stack 200. The second undesired portions 214U can be removed in further operations, as described below.

In some embodiments, operation 190 is not performed, and the first filler material 213 fills one or more of the one or more narrow trenches 210 and/or the modified deep trench 211. In some embodiments, operation 190 deposits the second filler material 214 in the modified deep trench 211, but not in the one or more narrow trenches 210. In some embodiments, operation 190 deposits the second filler material 214 in the one or more narrow trenches 210, but not in the modified deep trench 211.

Figure 2K:
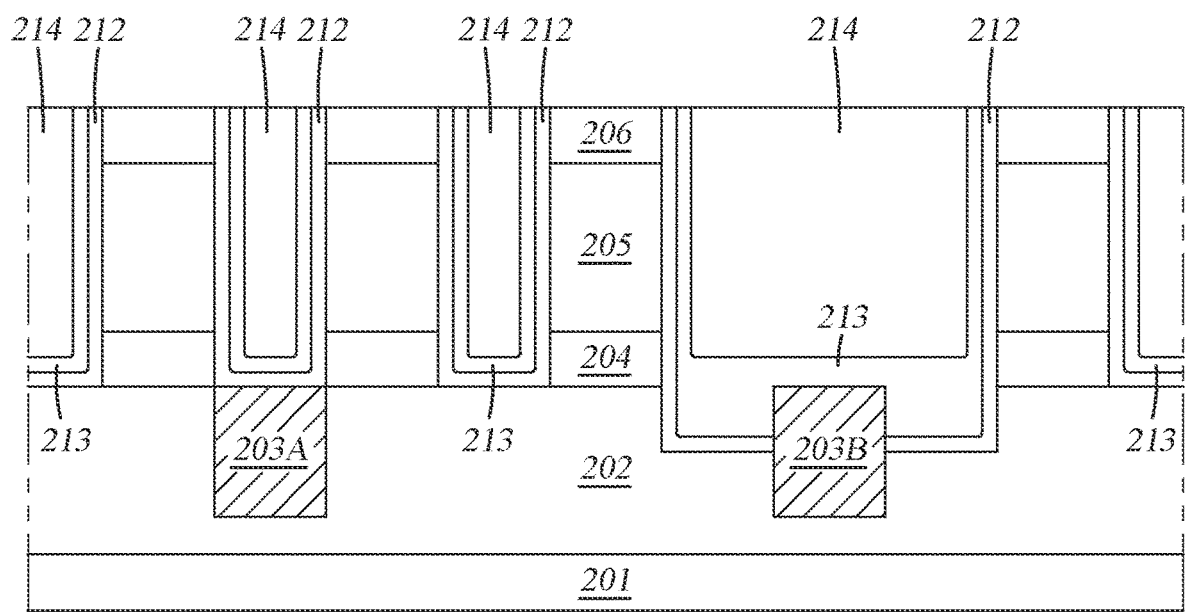

At operation 195, undesired filler portions are removed (e.g., first undesired portions 213U, if present, and/or second undesired portions 214U, if present), as shown in FIG. 2K. The undesired filler portions can be removed by planarizing the surface. Planarizing the surface includes a chemical mechanical polishing (CMP) process, according to one embodiment.

The modified deep trench 211 that is formed around the metal contact 203B allows for a drop in resistance R as compared to traditional trenches (i.e., a trench that exposes the top of a metal contact, but does not expose the sides of the metal contact). The drop in resistance results in a drop in the voltage V (V=IR, where I is the current). The modified deep trench 211 disclosed herein can reduce the R and the V by up to about 50%, such as by about 40%.

The increased depth of modified deep trench 211 results in a reduced V on a power rail due to reduced IR drop. In addition, maintaining a lower depth and width for the narrow trenches 210 results in a reduced capacitance (C), thus reducing the time constant T=RC. Thus, the combination of the modified deep trench 211 and the narrow trenches 210 allows for a balance between reducing both the V drop and the T of the layer stack 200. Alternatively, for similar performance, the modified deep trench 211 width (e.g., the power rail width) can me modified by a similar proportion as the increase in depth of the modified deep trench, thus enabling reduced area. In embodiments where the first filler material 213 and/or the second filler material 214 include Co and/or Ru, a deeper modified deep trench 211 provides IR drop reduction that can minimize the penalty.

Figure 3:
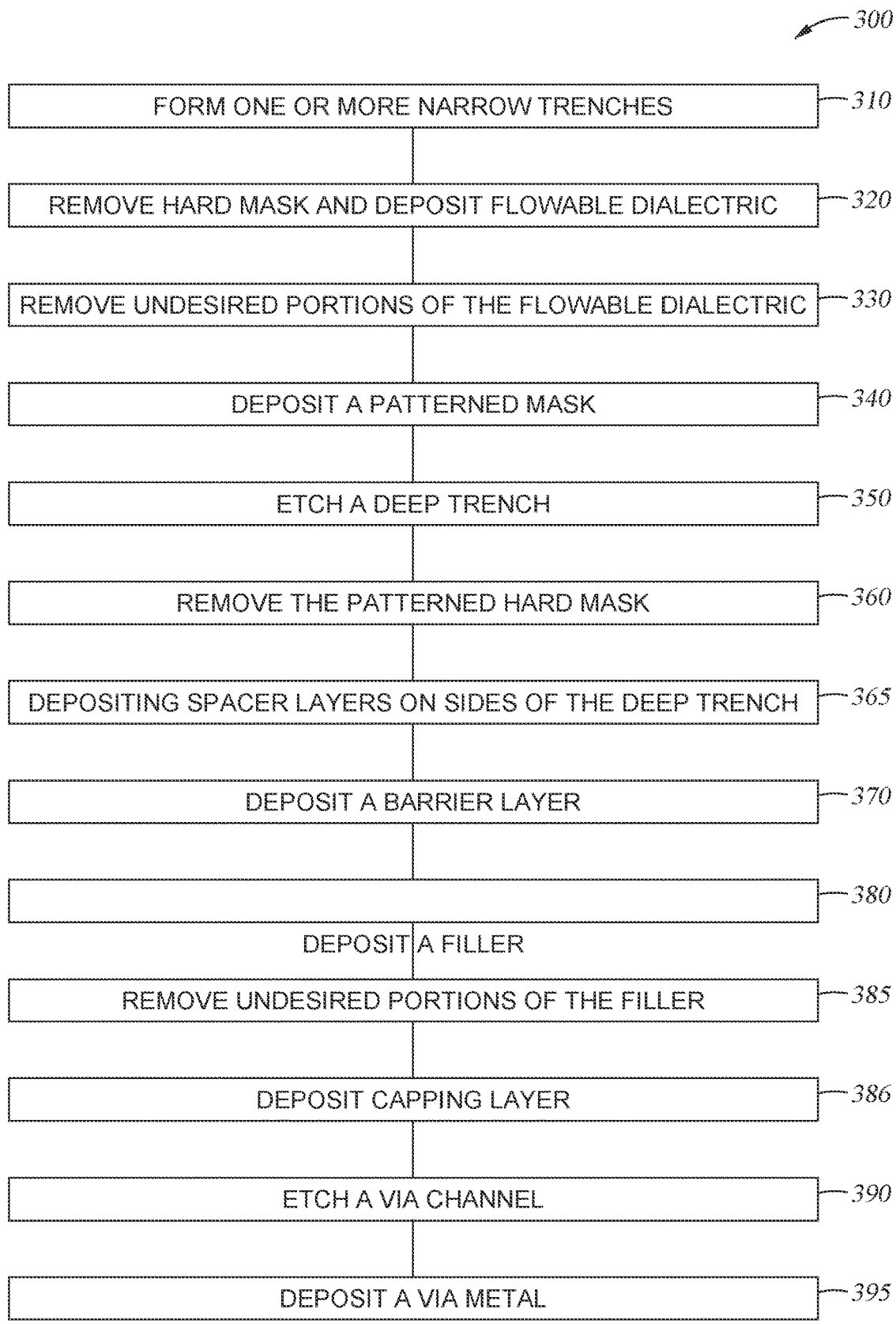
FIG. 3 is a flow chart of method operations for forming a modified deep trench in a layer stack, according to one embodiment.

FIG. 3 is a flow chart of method 300 operations for forming a modified deep trench in a layer stack (e.g., layer stack 400 of FIG. 4A), according to one embodiment. Although the method 300 operations are described in conjunction with FIGS. 3 and 4A-M, persons skilled in the art will understand that any system configured to perform the method 300 operations, in any order, falls within the scope of the embodiments described herein.

Figure 4A:
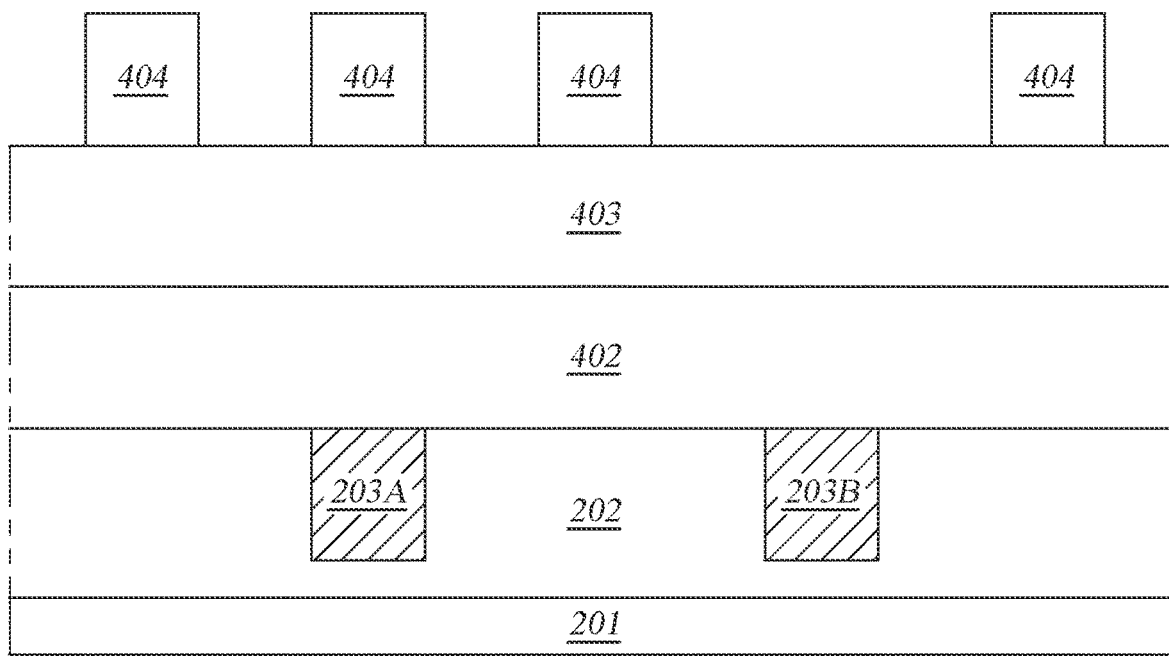
FIGS. 4A-N illustrate a layer stack, according to one embodiment.

FIG. 4A illustrates the layer stack 400, according to one embodiment. As shown, the layer stack 400 includes the substrate 201, the first dielectric layer 202, a plurality of metal contacts 203, a first layer 402, a second layer 403, and a plurality of hard masks 404. The first layer 402 can include one or more metals, such as ruthenium (Ru), molybdenum (Mo), tungsten (W), any alloys of the above, and any combination of the above. The second layer 403 can include an insulating material, such as an oxide. The hard masks 404 can be substantially similar to the hard masks 207 of FIG. 2A as described above.

Figure 4B:
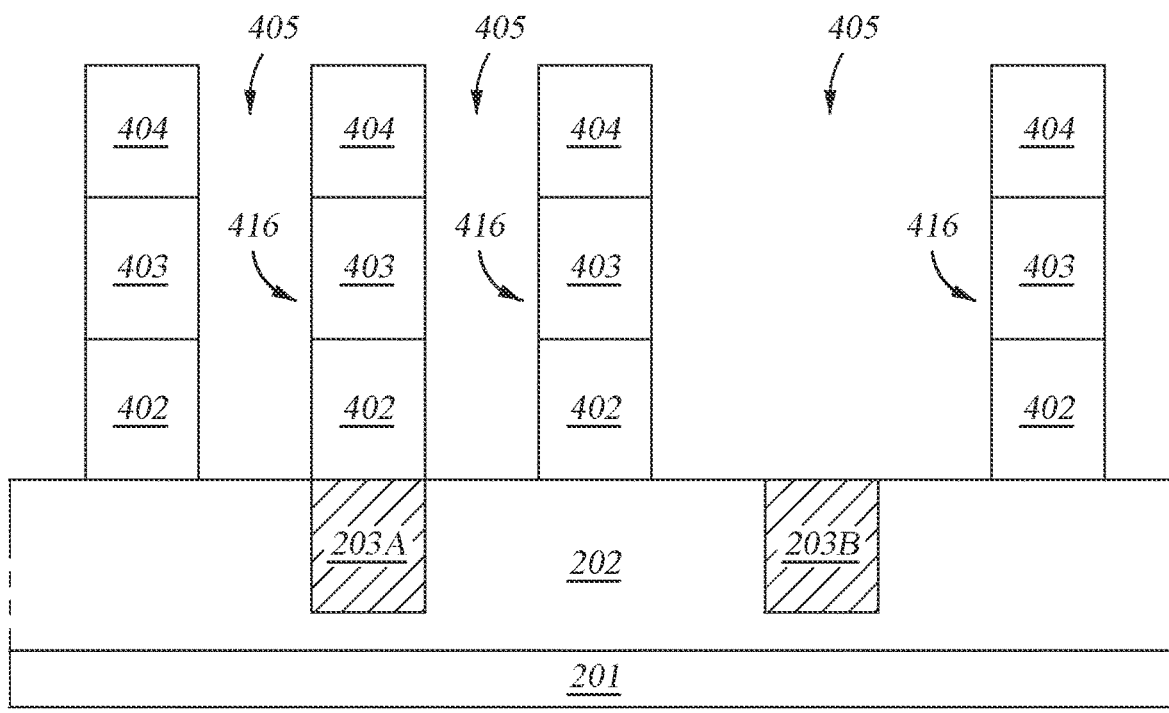

The method 300 begins at operation 310, where one or more narrow trenches (e.g., narrow trenches 405) are formed, as shown in FIG. 4B. The one or more narrow trenches 405 are formed by etching a portion of the first layer 402 and the second layer 403 through the hard masks 404. During operation 310, a plurality of layer features (e.g., plurality of layer features 416) are formed. The plurality of layer features 416 include material from the first layer 402 and the second layer 403 that were not etched during operation 310. During operation 310, at least a portion of the deep metal contact 203B is exposed, according to one embodiment. At least a portion of one of the one or more narrow metal contacts 203A is disposed under one of the plurality of layer features 416, according to one embodiment. The first layer 402 portions of the plurality of layer features 416 can be the $M_0$ element of a layer superstack.

Figure 4C:
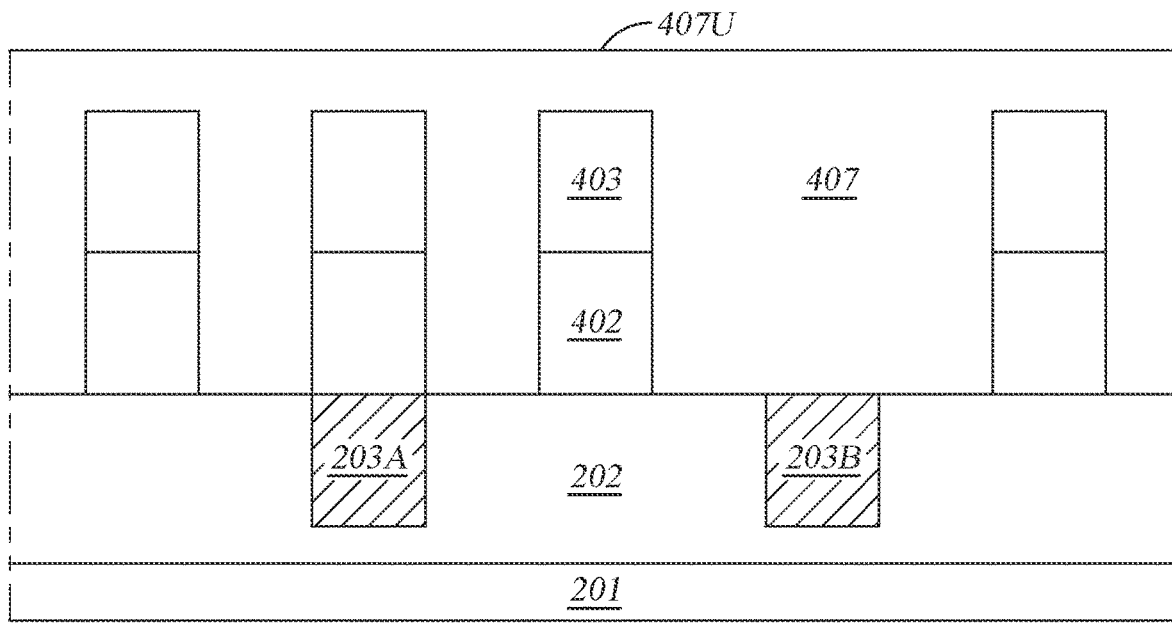

At operation 320, the hard masks 404 are removed and a flowable dielectric (e.g., flowable dielectric 407) is deposited over the plurality of layer features 416 and the first dielectric layer 202, as shown in FIG. 4C. The flowable dielectric 407 can include a low-k dielectric, such as SiOC.

In some embodiments, first undesired portions 407U of the flowable dielectric 407 are present at various locations over the layer stack 400. The first undesired portions 407U can be removed in further operations, as described below.

Figure 4D:
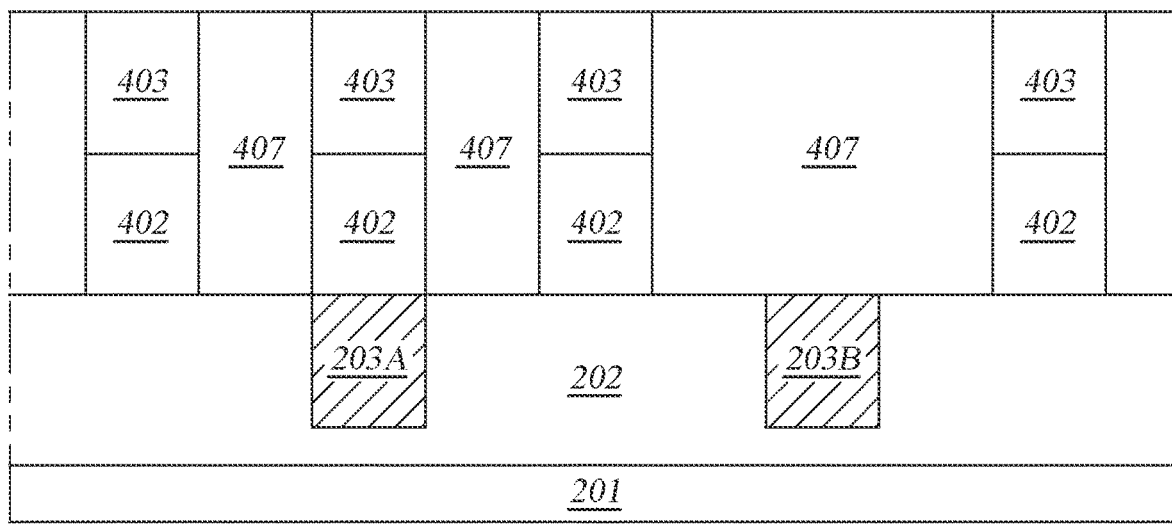

At operation 330, first undesired portions are removed (e.g., first undesired portions 407U), as shown in FIG. 4D. The first undesired portions 407U can be removed by planarizing the surface. The planarizing the surface includes a CMP process, according to one embodiment.

Figure 4E:
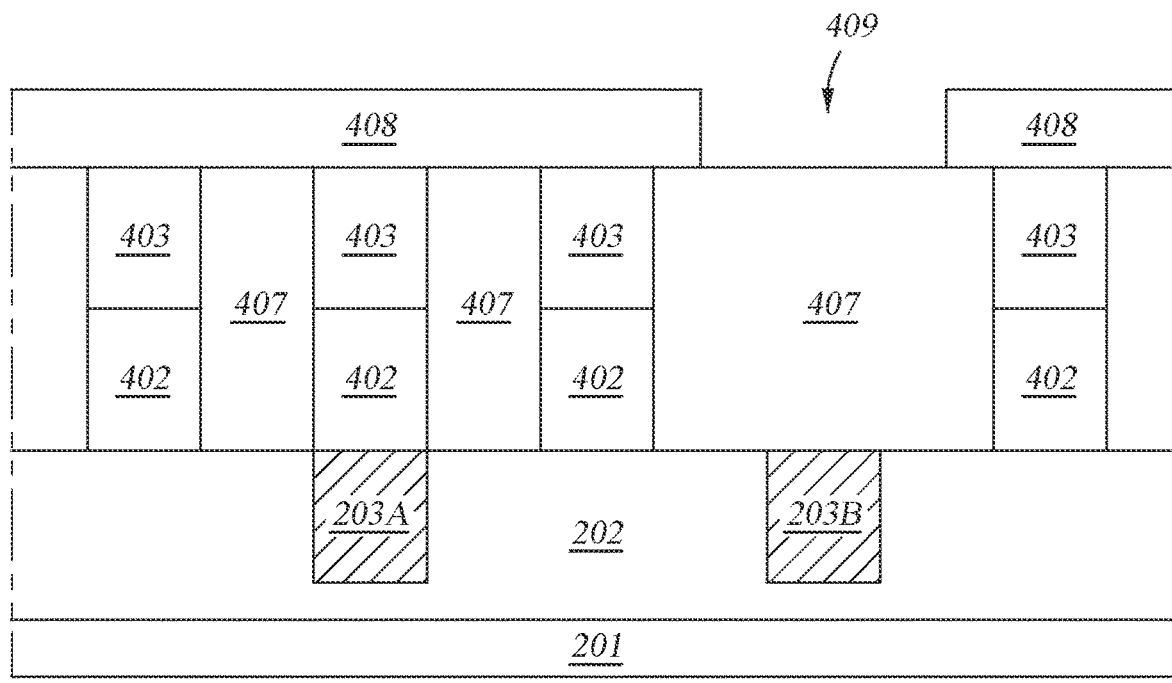

At operation 340, a patterned mask (e.g., patterned mask 408) is deposited on the layer stack 400, as shown in FIG. 4E. The patterned mask 408 can be substantially similar to the patterned mask 208 described above in the discussion of FIG. 2B. The patterned mask 408 can also be substantially similar to the hard masks 207 described above in the discussion of FIG. 2A.

Figure 4F:
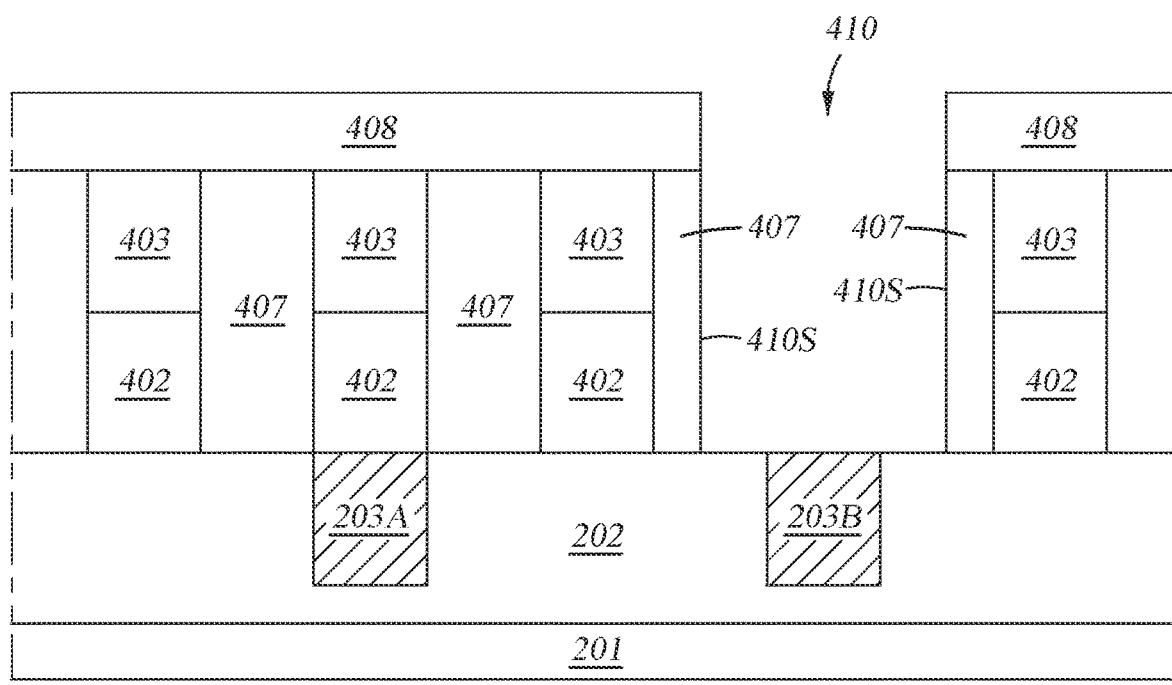

At operation 350, a deep trench (e.g., deep trench 410) is etched in the flowable dielectric 407, as shown in FIG. 4F. The deep trench 410 is etched through an opening 409 in the patterned mask 408 (FIG. 4E). The deep metal contact 203B can be exposed by the deep trench 410. The deep trench 410 can penetrate partially or entirely through the first layer 402. The deep trench 410 can be part of a power rail. The depth of the deep trench 410 varies from about 150 Å to about 300 Å.

Figure 4G:
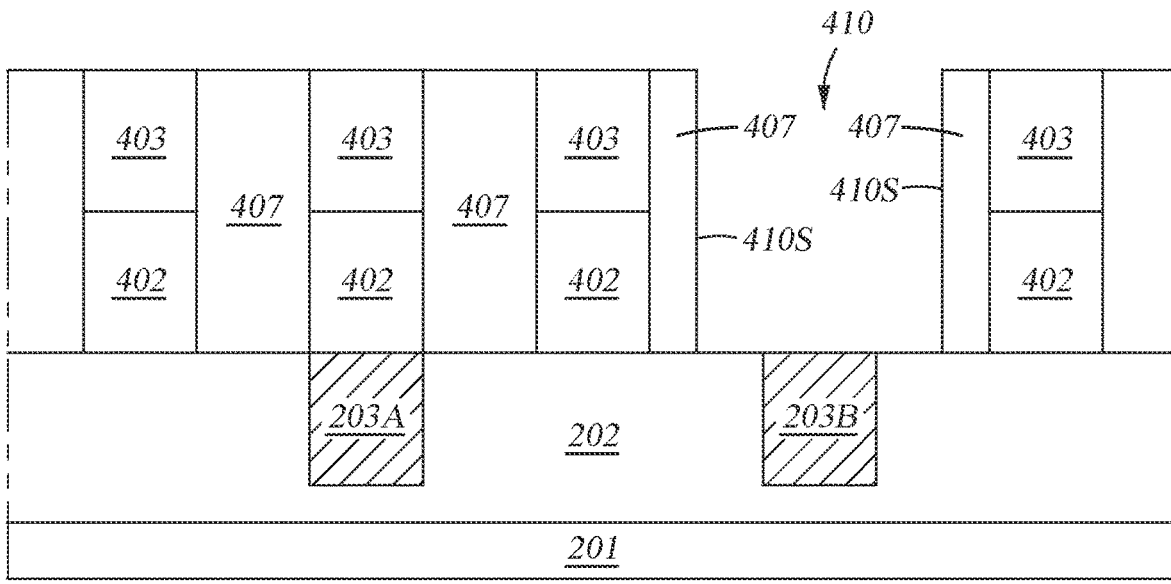

At operation 360, the patterned mask 408 is removed, as shown in FIG. 4G. The removal of the patterned mask can be substantially similar to operation 130 described above in the discussion of FIG. 1.

Figure 4H:
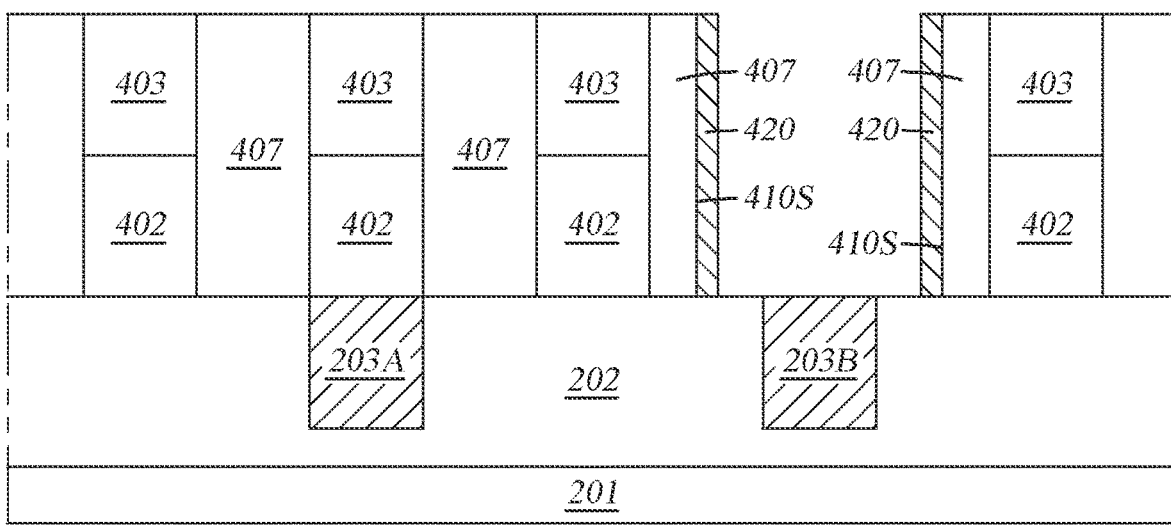

At operation 365, a plurality of spacer layers (e.g., spacer layers 420) are deposited on sides 410S of the deep trench 410, as shown in FIG. 4H. The spacer layers 420 can include any dielectric, such as silicon nitride or silicon dioxide. The spacer layers 420 increase the electrical isolation between portions of the first layer 402 and any material deposited in the deep trench 410.

Figure 4I:
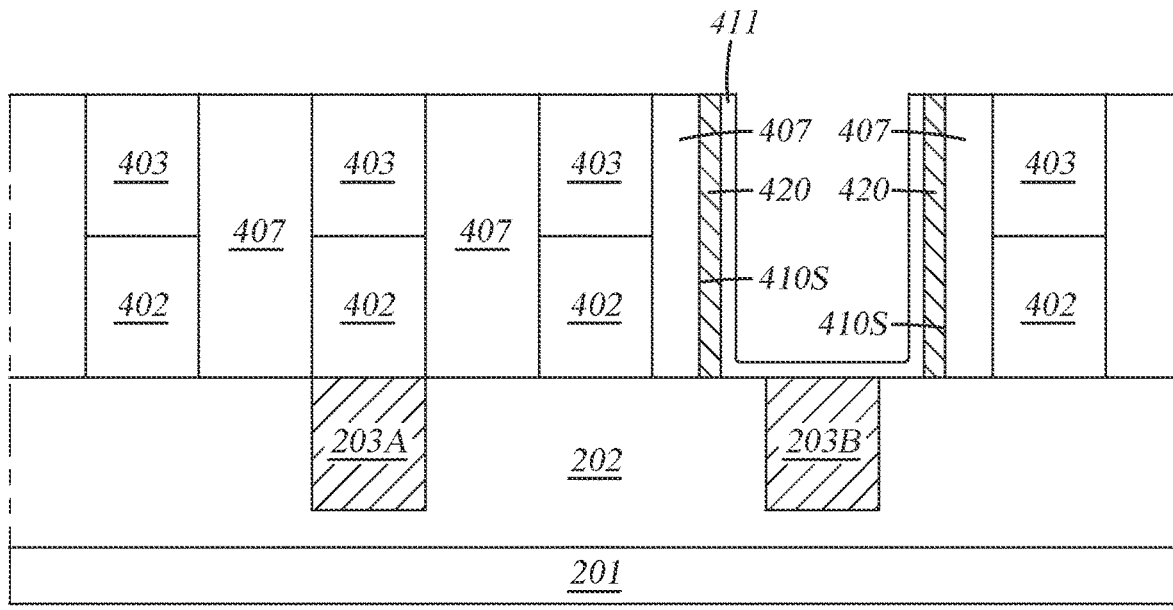

At operation 370, a barrier layer (e.g., barrier layer 411) is deposited in the deep trench 410, as shown in FIG. 4I. The barrier layer 411 can be substantially similar to the barrier layer 212 described in the discussion of FIG. 2H. The deposition of the barrier layer can be substantially similar to operation 170 described above in the discussion of FIG. 1.

Figure 4J:
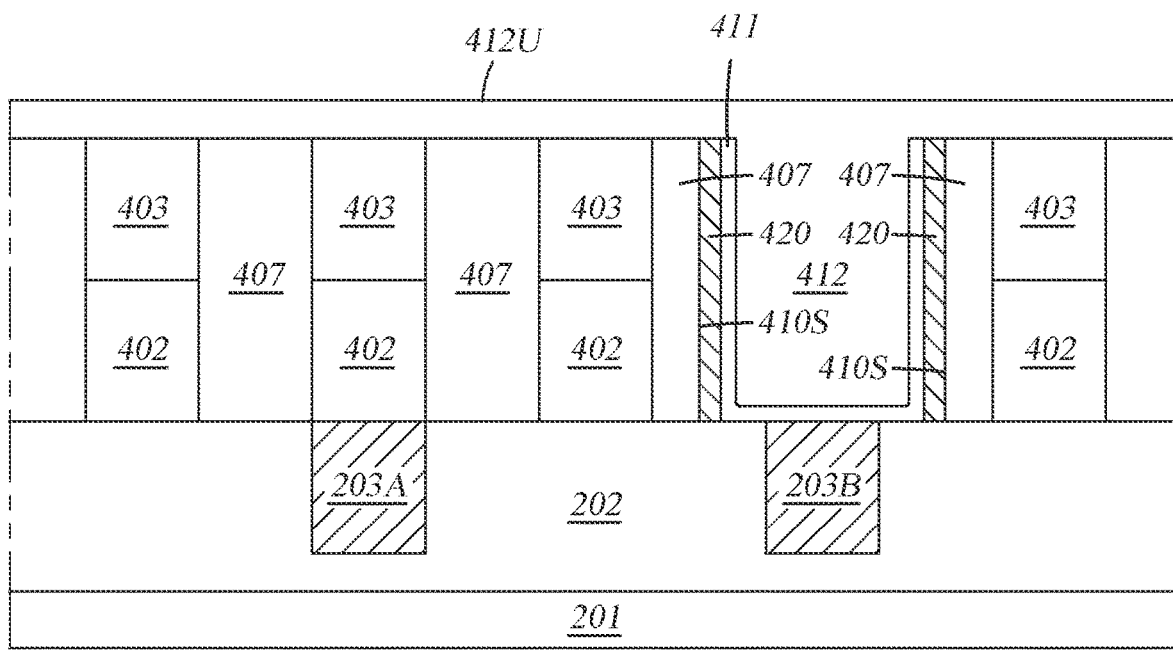

At operation 380, a first filler material (e.g., first filler material 412) is deposited over the barrier layer 411, as shown in FIG. 4J. The first filler material 412 can be substantially similar to the first filler material 213 described above in the discussion of FIG. 2I. The deposition of the first filler material 412 can be substantially similar to operation 180 described above in the discussion of FIG. 1.

In some embodiments, a second filler material (not shown) can be deposited over the first filler material 412. The second filler material can be substantially similar to the second filler material 214 described above in the discussion of FIG. 2J. The deposition of the second filler material can be substantially similar to operation 190 described above in the discussion of FIG. 1.

In some embodiments, first undesired portions 412U of the first filler material 412 are present at various locations over the layer stack 400. In some embodiments, second undesired portions (not shown) of the second filler material are present at various locations over the layer stack 400. The first undesired portions 412U and the second undesired portions can be removed in further operations, as described below.

Figure 4K:
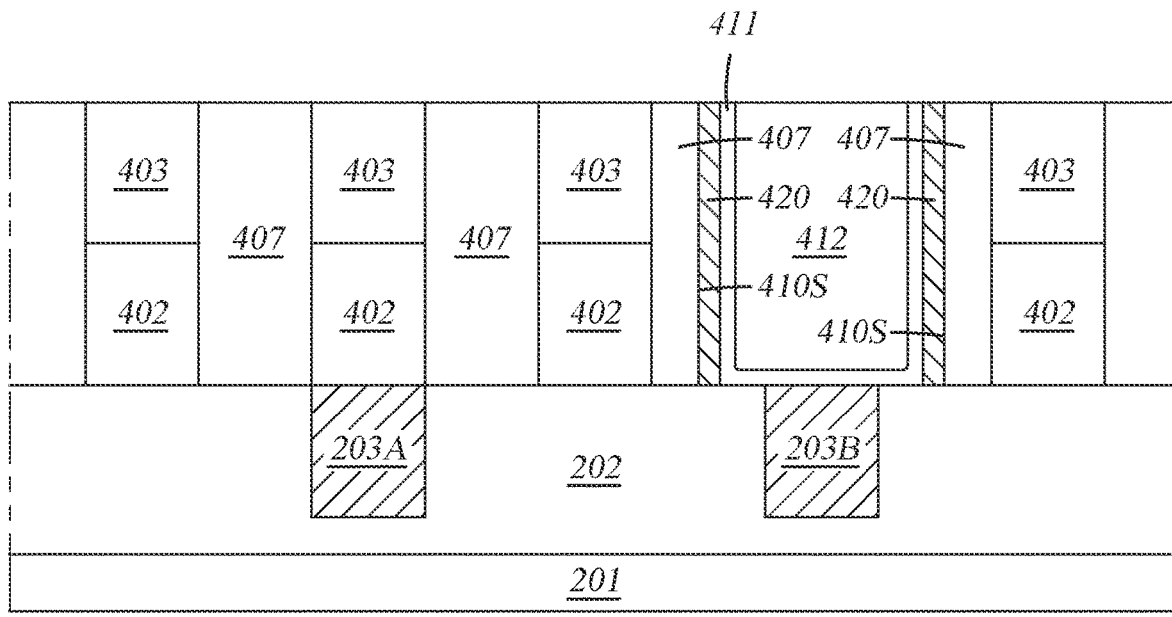

At operation 385, undesired filler portions are removed (e.g., first undesired portions 412U, if present, and/or second undesired portions, if present), as shown in FIG. 4K. The removal of the undesired filler portions can be substantially similar to operation 195 described above in the discussion of FIG. 1.

Figure 4L:
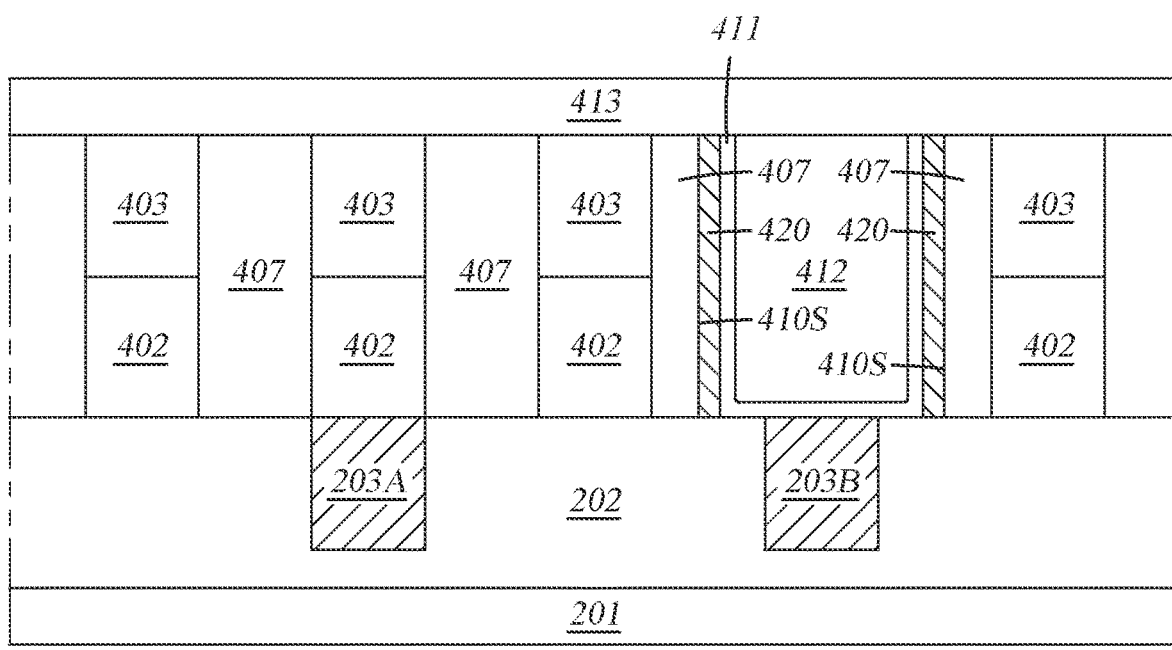

At operation 386, a capping layer (e.g., capping layer 413) is deposited over the layer structure 400, as shown in FIG. 4L. The capping layer 413 can include a dielectric material.

Figure 4M:
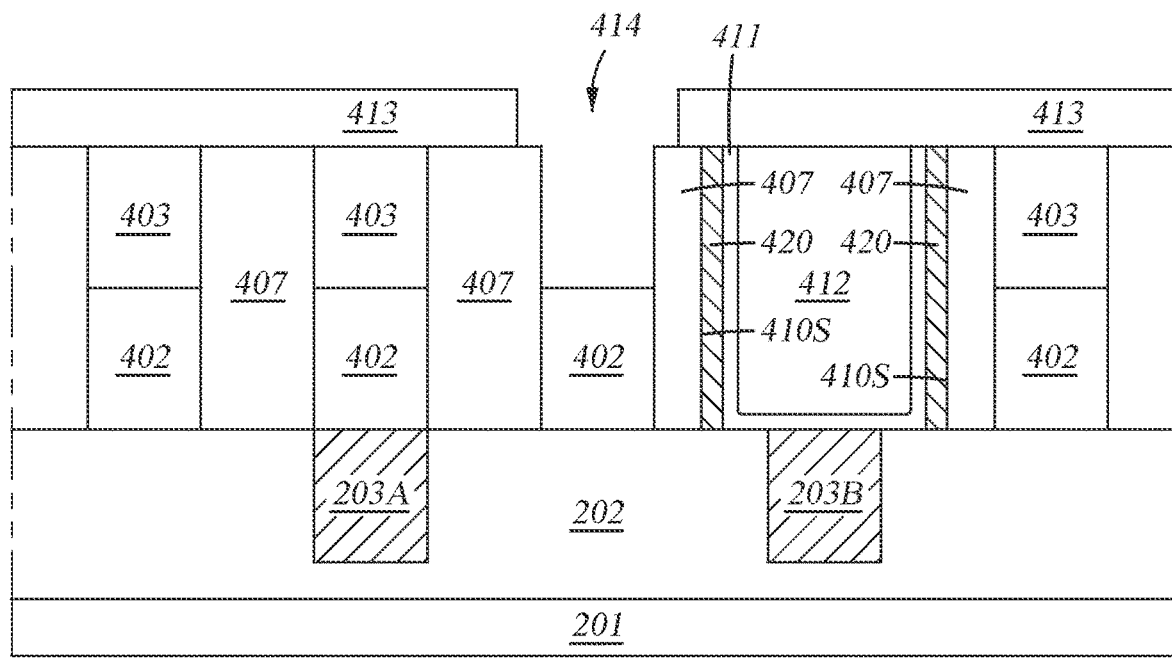

At operation 390, a via channel (e.g., via channel 414) is etched through the capping layer 413 and at least a portion of the second layer 403, as shown in FIG. 4M.

Figure 4N:
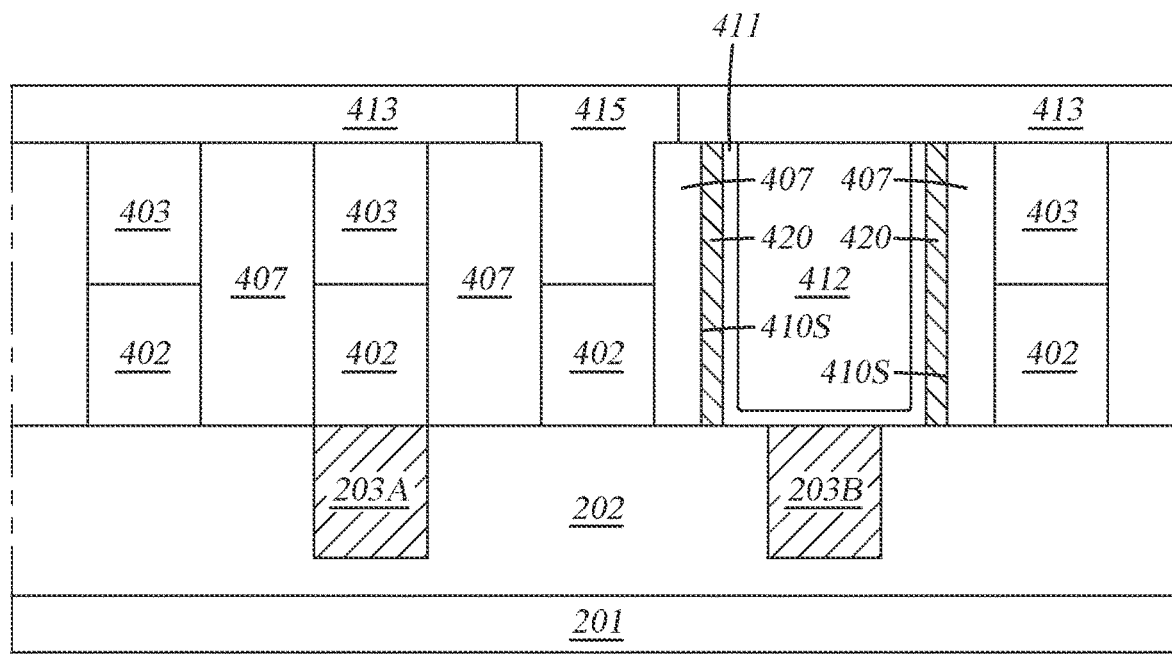

At operation 395, a via material (e.g., via material 415) is deposited in the via channel 414, as shown in FIG. 4N. The via material 415 and the first filler material 412 include the same material, according to one embodiment.

The increased depth of the deep trench 410 results in a reduced V due to reduced IR. In addition, maintaining a lower depth and width for the narrow trenches 405 results in a reduced capacitance (C), thus reducing the time constant T=RC. Thus, the combination of the deep trench 410 and the narrow trenches 405 allows for a balance between reducing both the V drop and the T of the layer stack 400.

Figure 5:
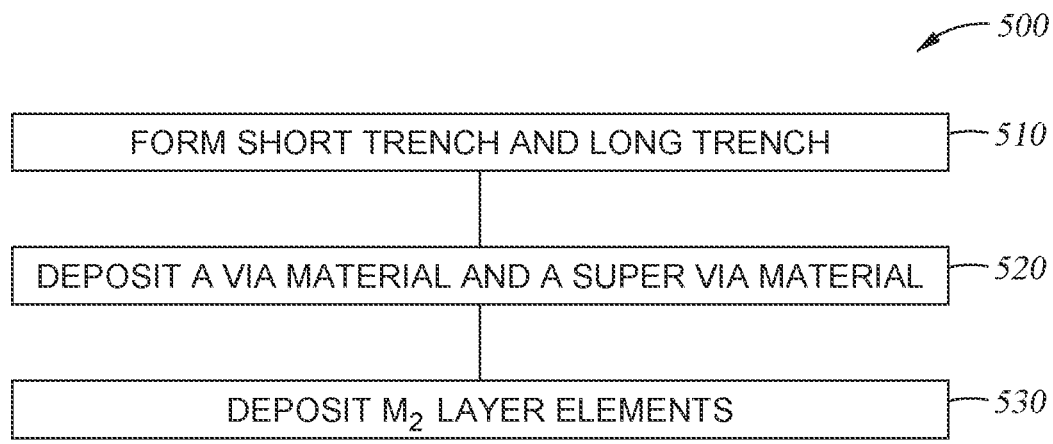
FIG. 5 is a flow chart of method operations for forming a via and a super via in a layer superstack, according to one embodiment.

FIG. 5 is a flow chart of method 500 operations for forming a via and a super via in a layer superstack (e.g., layer superstack 600 of FIG. 6A), according to one embodiment. Although the method 500 operations are described in conjunction with FIGS. 5 and 6A-D, persons skilled in the art art will understand that any system configured to perform the method 500 operations, in any order, falls within the scope of the embodiments described herein.

Figure 6A:
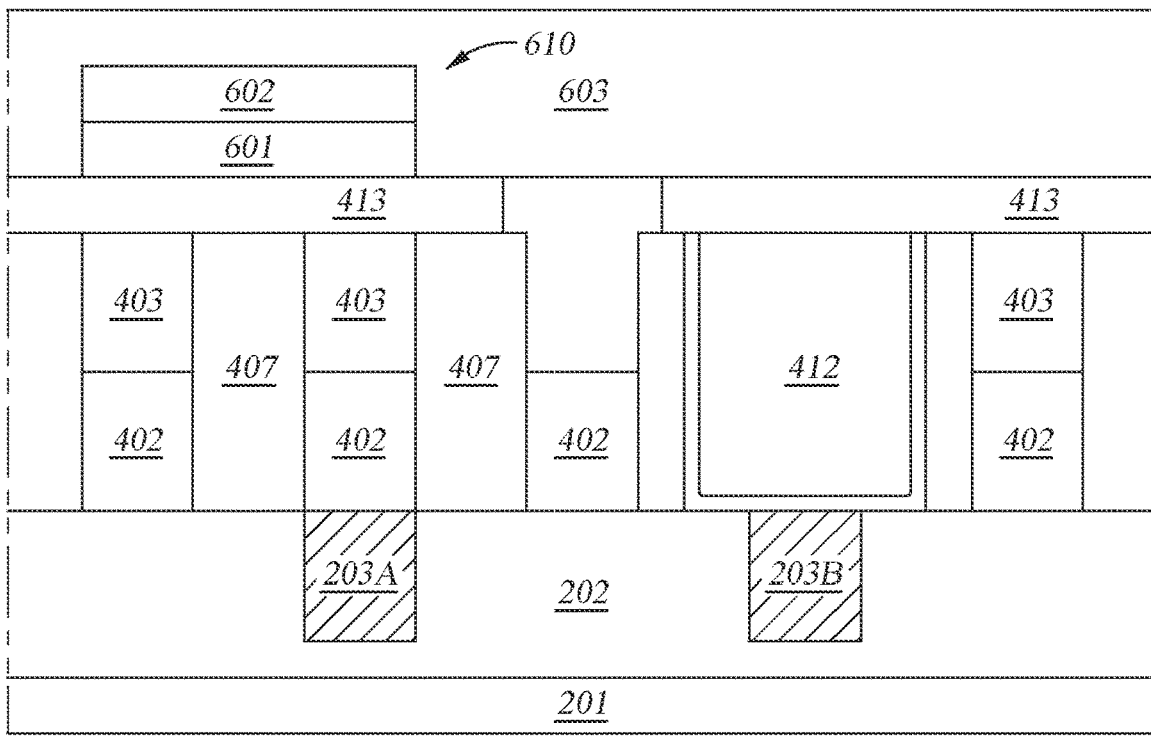
FIGS. 6A-D illustrate a layer superstack, according to one embodiment.

FIG. 6A illustrates the layer superstack 600, according to one embodiment. As shown, the layer superstack 600 includes a first layer stack 611 and a second layer stack 610. The first layer stack 611 includes the substrate 201 and a plurality of other layers disposed thereon. The first layer stack 611 can be substantially similar to the layer stack 400 shown in FIG. 4N.

The second layer stack 610 is disposed over the first layer stack 611. As shown, the second layer stack 610 includes a first layer 601, a second layer 602, and a flowable dielectric 603. The first layer 601 can be substantially similar to the first layer 402 as discussed above in the discussion of FIG. 4A. The second layer 602 is disposed over the first layer 601. The second layer 602 can be substantially similar to the second layer 403 described above in the discussion of FIG. 4A. The flowable dielectric 603 is disposed over the second layer 602, and the flowable dielectric is disposed to the side of the first layer 601 and the second layer 602. The flowable dielectric 603 is substantially similar to the flowable dielectric 407 as discussed above in the discussion of FIG. 4C. The first layer 601 can be the $M_1$ element of the layer superstack 600.

Figure 6B:
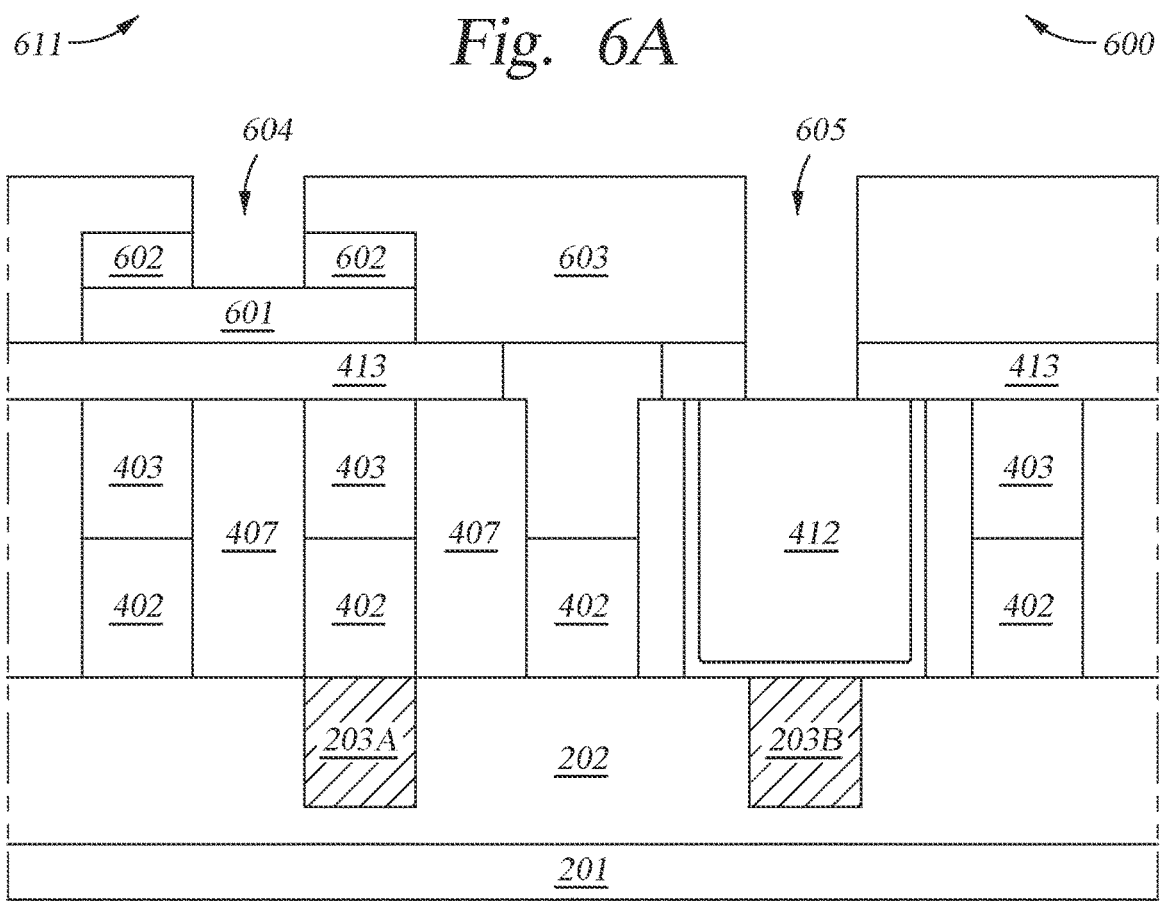

The method 500 begins at operation 510, where a via trench (e.g., via trench 604) and a super via trench (e.g., super via trench 605) is formed in the layer superstack 600, as shown in FIG. 6B. The super via trench 605 exposes at least a portion of the first filler material 412. Operation 510 can include forming the via trench 604 and the super via trench 605 at the same step. Operation 510 can include forming the via trench 604 in one suboperation, and forming the super via trench 605 in another suboperation.

Figure 6C:
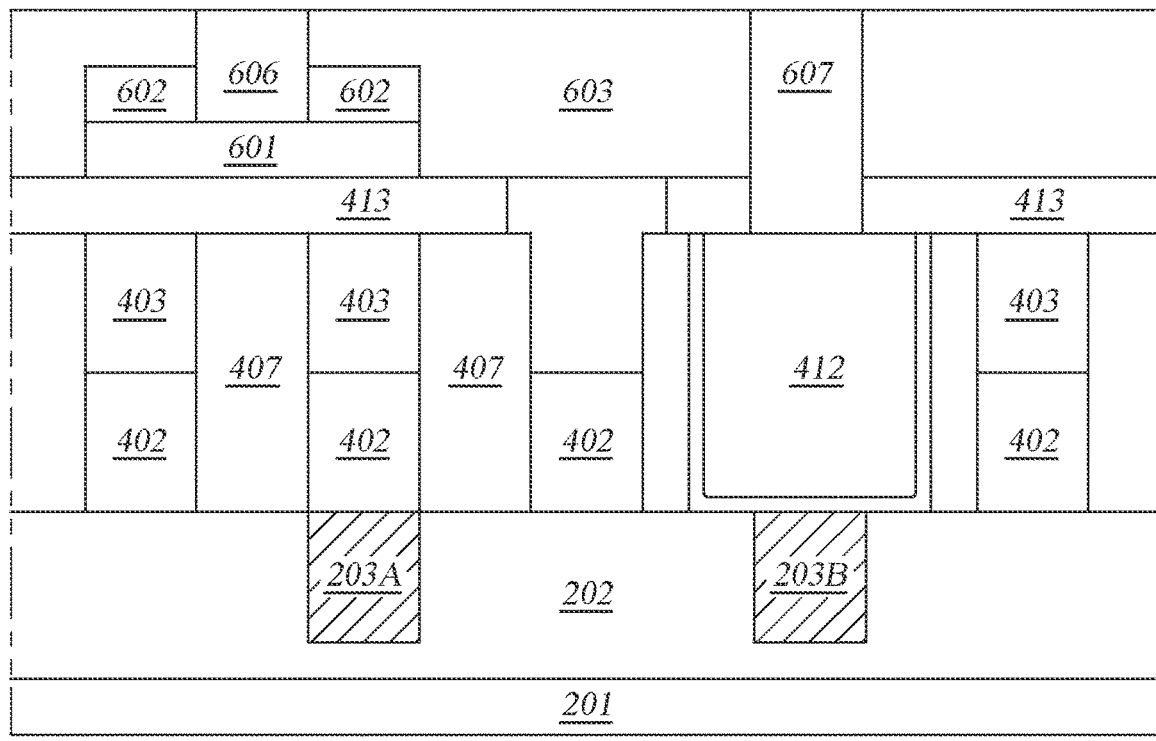

At operation 520, the via trench 604 is filled with a via material (e.g., via material 606) in the via trench and the super via trench is filled with a super via material (e.g., super via material 607) as shown in FIG. 6C. The via material 606 and the super via material 607 each include a via conducting material and a super via conducting material, respectively. The via conducting material and the super via conducting material each include a conducting material, such as a metal, such as Ru, W, Co, Mo, alloys thereof, and any combination thereof. The via material 606 and the super via material 607 include the same material, according to one embodiment. Operation 520 can include filling the via material 607 and the super via material 607 in the same operation. Operation 520 can include filling the via material 607 in one suboperation, and filling the super via material 607 in another suboperation.

Figure 6D:
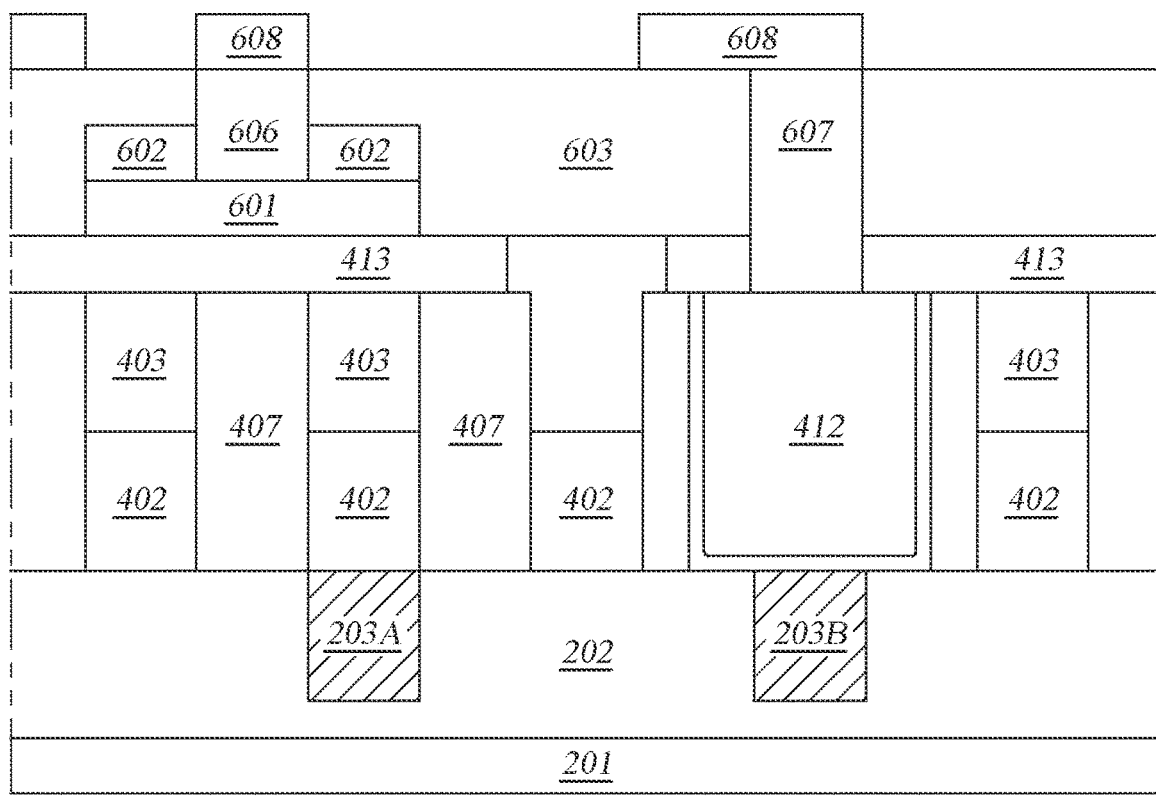

At operation 530, a plurality of $M_2$ layer elements (e.g., $M_2$ layer elements 608) are deposited over a top layer of the second layer stack (e.g., second layer stack 610) as shown in FIG. 6D. For example, the top layer includes the capping layer 413. The plurality of $M_2$ layer elements 608 can include Ru, W, Co, Mo, alloys thereof, and any combination thereof. An electrical connection is formed between one of the plurality of $M_2$ layer elements 608 and the first filler material 412, according to one embodiment. The plurality of $M_2$ layer elements 608 and the first filler 412 material comprise different materials, according to one embodiment. The plurality of $M_2$ layer elements 608 can be the $M_2$ elements of the layer superstack 600. Thus, the combination of the $M_2$ layer element 608, the super via material 607, and the first filler material 412 acts as a via shunt, or via straddle. The via shunt (or via straddle) allows for a low R connection between the first filler material 412 (e.g., the $M_0$ layer element) and the $M_2$ layer element.

As described above, methods of modifying portions of layer stacks are provided. A method of forming a deep trench includes etching portions of a flowable dielectric, such that a deep metal contact is disposed below the deep trench. The deep trench is selectively etched to form a modified deep trench. A method of forming a super via includes forming a super via trench through a second layer stack of a layer superstack.

The methods disclosed herein allow for decreasing the resistance, and thus the voltage drop, of features in a semiconductor layer stack. The methods allow for changing layer materials to higher resistivity features, as the higher resistance from the material change is at least partially counteracted by modifications of the feature shapes and depths, as described above. In addition, including narrow trenches allows simultaneous dropping of the time constant of the layer stack.

While the foregoing is directed to implementations of the present invention, other and further implementations of the invention may be devised without departing from the basic scope thereof, and the scope thereof is determined by the claims that follow.

The invention claimed is:

1. A layer stack, comprising:
   a first dielectric layer of dielectric material;
   a plurality of metal contacts comprising a deep metal contact, the plurality of metal contacts at least partially in the first dielectric layer;
   a first etch stop layer disposed over and in contact with the first dielectric layer;
   a second dielectric layer over the first etch stop layer;
   one or more narrow trenches in the first etch stop layer and the second dielectric layer, a depth of the one or more narrow trenches defined by the first etch stop layer; and
   a modified deep trench in the first etch stop layer, the second dielectric layer, and the first dielectric layer, the modified deep trench over the deep metal contact, the modified deep trench having a deeper depth than a depth of at least one of the narrow trenches, the modified deep trench extending partially into the dielectric material of the first dielectric layer.

2. The layer stack of claim 1, further comprising a barrier layer over the modified deep trench.

3. The layer stack of claim 1, further comprising a first filler material comprising a first conductive material, the first filler material at least partially filling the modified deep trench.

4. The layer stack of claim 3, further comprising a second filler material, wherein:
   the second filler material comprises a second conductive material different than the first conductive material,
   the second filler material is over the first filler material, and
   the second filler material at least partially fills the modified deep trench.

5. The layer stack of claim 3, wherein the first filler material at least partially fills at least one narrow trench.

6. The layer stack of claim 5, wherein a second filler material at least partially fills at least one narrow trench.

7. The layer stack of claim 6, wherein:
   the first filler material comprises cobalt (Co), and
   the second filler material comprises copper (Cu).

8. The layer stack of claim 1, wherein one of the one or more narrow trenches is over a metal contact.

9. The layer stack of claim 1, wherein the modified deep trench exposes at least a portion of the deep metal contact.

10. The layer stack of claim 9, wherein the modified deep trench exposes a top surface and portions of side surfaces of the deep metal contact.

11. A layer stack, comprising:
a first dielectric layer of dielectric material disposed over a substrate;
a plurality of metal contacts comprising a deep metal contact, the plurality of metal contacts at least partially in the first dielectric layer;
a first etch stop layer disposed over and in contact with the first dielectric layer;
a second dielectric layer over the first etch stop layer;
one or more narrow trenches in the first etch stop layer and the second dielectric layer, a depth of the one or more narrow trenches defined by the first etch stop layer; and
a modified deep trench in the first etch stop layer, the second dielectric layer, and the first dielectric layer, the modified deep trench over the deep metal contact, the modified deep trench having a deeper depth than a depth of at least one of the narrow trenches, the modified deep trench extending partially into the dielectric material of the first dielectric layer.

12. The layer stack of claim 11, further comprising:
a first filler material of a first conductive material, the first filler material at least partially filling the modified deep trench; and
a second filler material disposed over the first filler material, the second filler material being a second conductive material different than the first conductive material.

13. The layer stack of claim 12, wherein the first filler material comprises cobalt (Co), and the second filler material comprises copper (Cu).

14. The layer stack of claim 11, wherein the first dielectric layer separates the plurality of metal contacts from the substrate.

15. A layer stack, comprising:
a first dielectric layer of dielectric material disposed over a substrate;
a plurality of metal contacts comprising a deep metal contact, the plurality of metal contacts at least partially in the first dielectric layer;
a first etch stop layer disposed over and in contact with the first dielectric layer;
a second dielectric layer over the first etch stop layer, the first etch stop layer disposed between the second dielectric layer and the plurality of metal contacts;
one or more narrow trenches in the first etch stop layer and the second dielectric layer, a depth of the one or more narrow trenches defined by the first etch stop layer; and
a modified deep trench in the first etch stop layer, the second dielectric layer, and the first dielectric layer, the modified deep trench over the deep metal contact, the modified deep trench having a deeper depth than a depth of at least one of the narrow trenches, the modified deep trench extending partially into the dielectric material of the first dielectric layer.

16. The layer stack of claim 15, further comprising:
a first filler material comprising a first conductive material, the first filler material extending into the modified deep trench past the first etch stop layer.

17. The layer stack of claim 16, further comprising:
a second filler material comprising a second conductive material, the second conductive material being different than the first conductive material, the second conductive material comprising at least one of cobalt (Co), tungsten (W), or copper (Cu).

18. The layer stack of claim 15, wherein a first narrow trench of the one or more narrow trenches is disposed over a first metal contact of the plurality of metal contacts.

19. The layer stack of claim 15, further comprising:
a second etch stop layer disposed over the second dielectric layer, the one or more narrow trenches and the modified deep trench extending from the second etch stop layer toward the first dielectric layer.

20. The layer stack of claim 15, wherein the modified deep trench extends partially around the deep metal contact.

* * * * *